(12) United States Patent
Wakana et al.

(10) Patent No.: US 7,968,368 B2
(45) Date of Patent: Jun. 28, 2011

(54) METHOD OF MANUFACTURING A FIELD EFFECT TRANSISTOR HAVING AN OXIDE SEMICONDUCTOR

(75) Inventors: Hironori Wakana, Tokorozawa (JP); Hiroyuki Uchiyama, Musashimurayama (JP); Tetsufumi Kawamura, Kodaira (JP); Shinichi Saito, Kawasaki (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/695,361

(22) Filed: Jan. 28, 2010

(65) Prior Publication Data

US 2010/0210070 A1 Aug. 19, 2010

(30) Foreign Application Priority Data

Feb. 17, 2009 (JP) .................. 2009-033577

(51) Int. Cl.
*H01L 21/00* (2006.01)
*H01L 21/16* (2006.01)
*H01L 21/84* (2006.01)
(52) U.S. Cl. ................. 438/104; 438/149; 257/E21.046
(58) Field of Classification Search .................. 438/104, 438/149, 155, 150, 151; 257/E21.046, E21.058, 257/E21.039
See application file for complete search history.

(56) References Cited

U.S. PATENT DOCUMENTS

| | | | | |
|---|---|---|---|---|
| 5,629,115 | A * | 5/1997 | Kawano et al. | 430/5 |
| 6,727,522 | B1 | 4/2004 | Kawasaki et al. | |
| 7,018,783 | B2 * | 3/2006 | Iwasaki et al. | 430/321 |
| 2003/0143784 | A1 * | 7/2003 | Nishitani et al. | 438/149 |
| 2006/0138458 | A1 * | 6/2006 | Tanaka et al. | 257/197 |
| 2010/0210070 | A1 * | 8/2010 | Wakana et al. | 438/104 |

FOREIGN PATENT DOCUMENTS

| | | |
|---|---|---|
| JP | 2000-150900 | 5/2000 |
| JP | 2005-268724 | 9/2005 |

* cited by examiner

*Primary Examiner* — Walter L Lindsay, Jr.
(74) *Attorney, Agent, or Firm* — Miles & Stockbridge P.C.

(57) ABSTRACT

A method of manufacturing a field effect transistor, which has high alignment accuracy between a gate electrode and source and drain electrodes and can provide a transparent device at a low cost. Since a patterned light blocking film is formed on the rear side of a substrate and used as a photomask for forming a gate electrode pattern and a source and drain electrode pattern on the front side of the substrate, the number of photomasks is reduced, and self-alignment between the gate electrode and the source and drain electrodes is carried out, thereby improving the alignment accuracy of these electrodes. Thereby, a method of manufacturing a high-accuracy low-cost field effect transistor can be provided.

19 Claims, 24 Drawing Sheets

(1-7a)

(1-7b)

(1-8a)

(1-8b)

(1-9)

(2-1a)

(2-1b)

(2-2a)

(2-2b)

(2-3a)

(2-3b)

(2-4a)

(2-4b)

(2-5a)

(2-5b)

(2-6a)

(2-6b)

(3-1a) (3-1b)

(3-2a) (3-2b)

EXPOSURE (3-3a) (3-3b)

(3-4a)

(3-4b)

(3-5a)

(3-5b)

(3-6a)

(3-6b)

EXPOSURE (4-4a)

(4-4b)

(4-5a)

(4-5b)

EXPOSURE (4-6a)

(4-6b)

(4-7a)

(4-7b)

(4-8a)

(4-8b)

(4-9a)

(5-7a)

(5-7b)

(5-8a)

(5-8b)

(5-9)

(6-4a)

(6-4b)

(6-5a)

(6-5b)

(6-6a)

(6-6b)

(6-7a)

(6-7b)

(6-8a)

(6-8b)

(6-9)

(7-1a)

(7-1b)

EXPOSURE (7-2a)

(7-2b)

(7-3a)

(7-3b)

(7-7a)

(7-7b)

(7-8a)

(7-8b)

(7-9)

(8-1a) (8-1b)

(8-2a) (8-2b)

(8-3a) (8-3b)

(8-4a)

(8-4b)

(8-5a)

(8-5b)

(8-6a)

(8-6b)

(8-7a)

(8-7b)

(8-8a)

(8-8b)

(8-9)

METHOD OF MANUFACTURING A FIELD EFFECT TRANSISTOR HAVING AN OXIDE SEMICONDUCTOR

CLAIM OF PRIORITY

The present application claims priority from Japanese patent application JP 2009-033577 filed on Feb. 17, 2009, the content of which is hereby incorporated by reference into this application.

FIELD OF THE INVENTION

The present invention relates to a method of manufacturing a field effect transistor having an oxide semiconductor which is used as a channel and, more specifically, to a method, of manufacturing a field effect transistor in which source and drain electrodes and a gate electrode are formed in such a manner that the source and drain electrodes are self-aligned with the gate electrode.

BACKGROUND OF THE INVENTION

In recent years, the research and development of various display units having a thin film transistor (TFT) device have been made. Since this TFT is space-saving, it is used as a transistor for driving the display unit of portable equipment such as a mobile telephone, notebook personal computer or PDS (personal digital assistant). This TFT is mostly made from a silicon-based semiconductor material typified by crystalline silicon and amorphous silicon. This is because it can be manufactured by using the conventional production process and technology of semiconductor devices.

However, since the processing temperature is 350° C. or higher when the semiconductor production process is used, a substrate on which a semiconductor can be formed is limited. Particularly, most glass and flexible substrates have a heat resistant temperature of 350° C. or lower, and it is difficult to manufacture TFT by using the conventional semiconductor production process.

Therefore, the research and development of a TFT device (oxide TFT) which is obtained from an oxide semiconductor material and can be manufactured at a low temperature are now under way. Since the oxide TFT can be formed at a low temperature, it can be formed on a glass substrate or a flexible substrate such as a plastic substrate. Therefore, a device which has not been existent can be manufactured at a low cost. Further, it can be used in RF tags and display units by making use of the transparency of the oxide material. The prior art is disclosed in Japanese Unexamined Patent Application Publication No. 2000-150900 and Japanese Unexamined Patent Application Publication No. 2005-268724.

SUMMARY OF THE INVETNION

When the conventional semiconductor production process is used, a gate electrode can be aligned with source and drain electrodes accurately. However, photomasks for these electrodes are required, thereby boosting the production cost. To align the source and drain electrodes with the gate electrode accurately, a self-alignment technique in which a lower electrode metal pattern formed above a substrate is used for exposure is effective. However, in a device making use of the transparency of an oxide material, as electrode patterns to be aligned with each other are transparent, it is impossible to use this technique.

When a transparent device is to be materialized, there is no production method by which alignment between the electrodes and low cost can be attained at the same time, whereby the production of a low-cost transparent device cannot be realized.

Japanese Unexamined Patent Application Publication No. 2000-150900 discloses the sectional structure of a transistor in which a transparent material such as zinc oxide is used in a channel layer (conductive layer) to ensure that the transistor does not have light sensitivity at a visible range and the need for the formation of a light blocking layer is eliminated. However, Japanese Unexamined Patent Application Publication No. 2000-150900 does not disclose an inexpensive production method in which a low-accuracy inexpensive wet etching technique is used to form a lower electrode and an upper electrode both made of a transparent material in such a manner that they are self-aligned with each other to ensure accuracy and the number of expensive photomasks can be reduced by one by using the same photomask twice.

Japanese Unexamined Patent Application Publication No. 2005-268724 relates to an electronic device and a method of manufacturing the same and discloses a method of manufacturing an electronic device, capable of manufacturing a junction part between a semiconductor region and a conductor region in the same transparent oxide layer by a simple process. However, Japanese Unexamined Patent Application Publication No. 2005-268724 does not disclose an inexpensive production method in which a low-accuracy inexpensive wet etching technique is used to form a lower electrode and an upper electrode both made of a transparent material in such a manner that they are self-aligned with each other to ensure accuracy and the number of expensive photomasks can be reduced by one by using the same photomask twice. It is therefore an object of the present invention to provide a method of manufacturing an oxide semiconductor device, which has high alignment accuracy between a gate electrode and source and drain electrodes and can realize an inexpensive transparent device.

To address the above object, the method of manufacturing an oxide semiconductor device according to an aspect of the present invention includes: forming a mask pattern for a lower electrode from a light blocking film on the rear side of a substrate made of a translucent material; carrying out photolithography through the exposure of the rear side of the substrate at least twice using the light blocking film as a mask; and carrying out self-alignment between the lower electrode and an upper electrode both made of a transparent material.

In the manufacturing method of an aspect of the present invention, even when the substrate is formed from glass or a flexible material having thermoplasticity which can be transformed by heat, such as plastic, all the steps can be carried out at a low temperature. Therefore, upper wirings/electrode can be self-aligned with the lower electrode, and the oxide semiconductor device of the present invention is suitable for use in not only display units but also displays such as flexible electronic paper comprising a flexible substrate and RFID tags making use of its transparency.

According to an aspect of the present invention, in the method of manufacturing an oxide semiconductor device, in a portion in which alignment between a gate electrode and source and drain electrodes by a light blocking film pattern formed on the rear side of a substrate is required, the light blocking film formed on the rear side of the substrate is used as a photomask to carry out self-alignment between the source and drain electrodes and the gate electrode by photolithography through the exposure of the rear side of the substrate. Therefore, an electrode substrate in which the gate electrode is accurately aligned with the source and drain electrodes through an insulating film can be formed. The number of expensive photomasks can be reduced by using the light blocking film on the rear side of the substrate twice as a photomask, thereby making it possible to greatly cut the production cost.

DETAILED DESCRIPTION OF THE PREFERRED EMBODIMENTS

Preferred embodiments of the present invention will be described hereinbelow.

First Embodiment

A first embodiment of the method of manufacturing an oxide semiconductor thin film transistor according to the present invention will be described with reference to FIGS. 1 to 3. This embodiment is for a bottom gate/top contact structure characterized in that the pattern of a light blocking film 102 formed on the rear side of a substrate 101 is a positive pattern for a gate electrode 103. Figures having a letter "a" at the end are top views, and figures having a letter "b" at the end are sectional views which show parts along dotted lines in the top views. The same shall apply to the figures of other embodiments.

Figure 1:
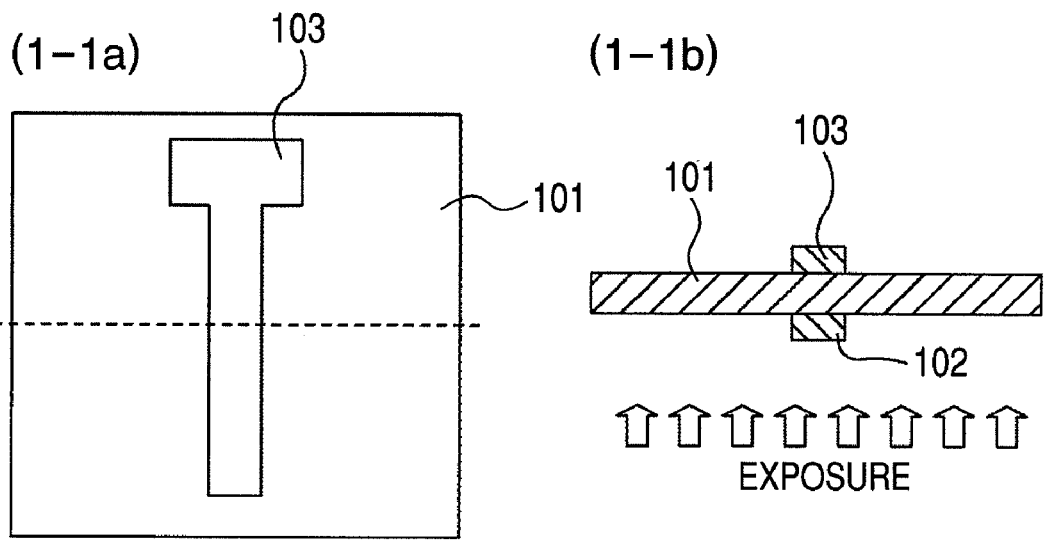
FIGS. 1(1-1a), 1(1-2a) and 1(1-3a) are top views, and FIGS. 1(1-1b), 1(1-2b) and 1(1-3b) are sectional views in the manufacturing method of a first embodiment.
Figure 1:
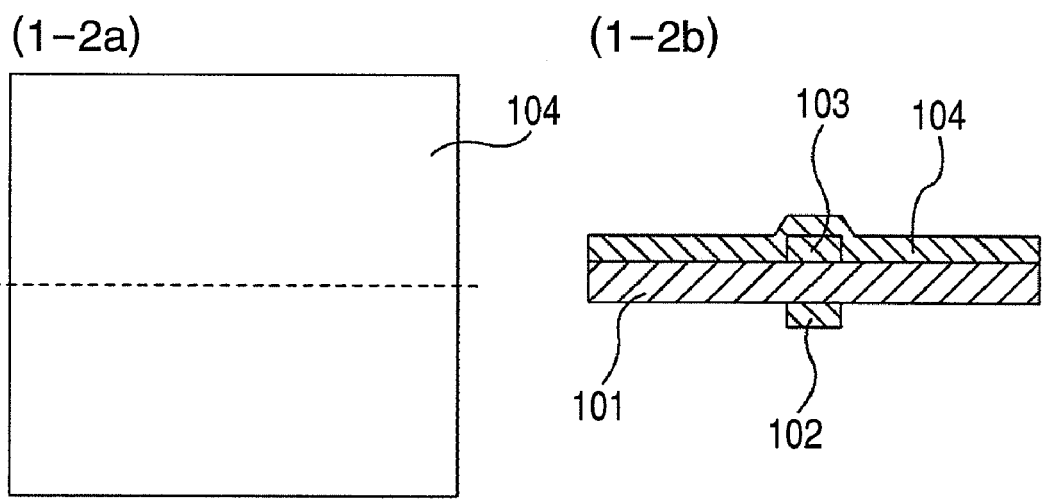
Figure 1:
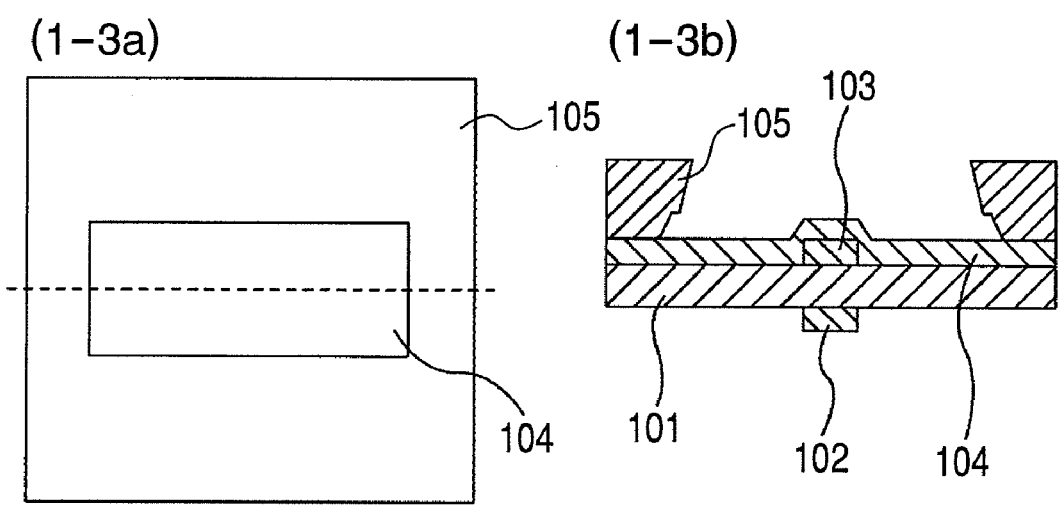
Figure 2:
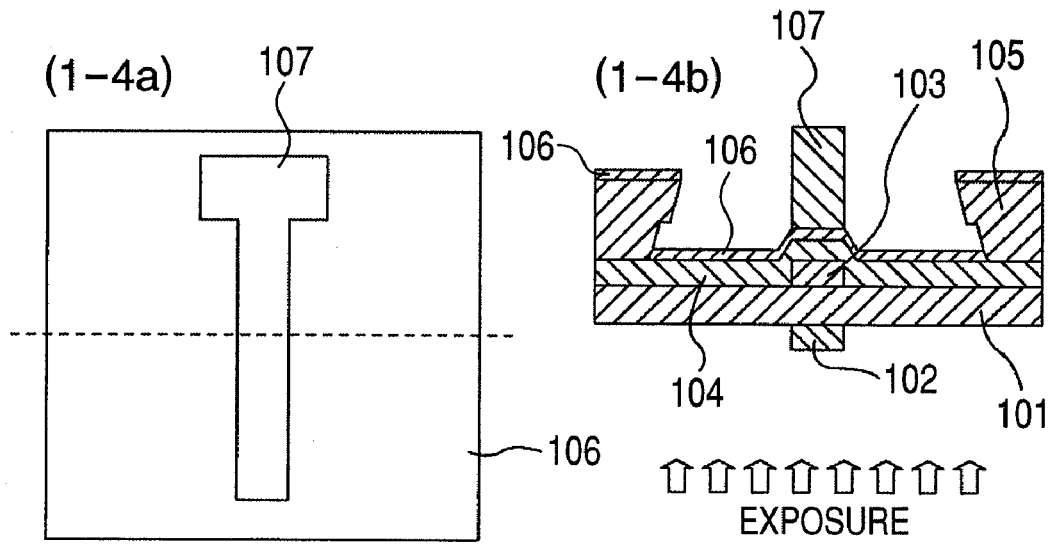
FIGS. 2(1-4a), 2(1-5a) and 2(1-6a) are top views, and FIGS. 2(1-4b), 2(1-5b) and 2(1-6b) are sectional views in the manufacturing method of the first embodiment.
Figure 2:
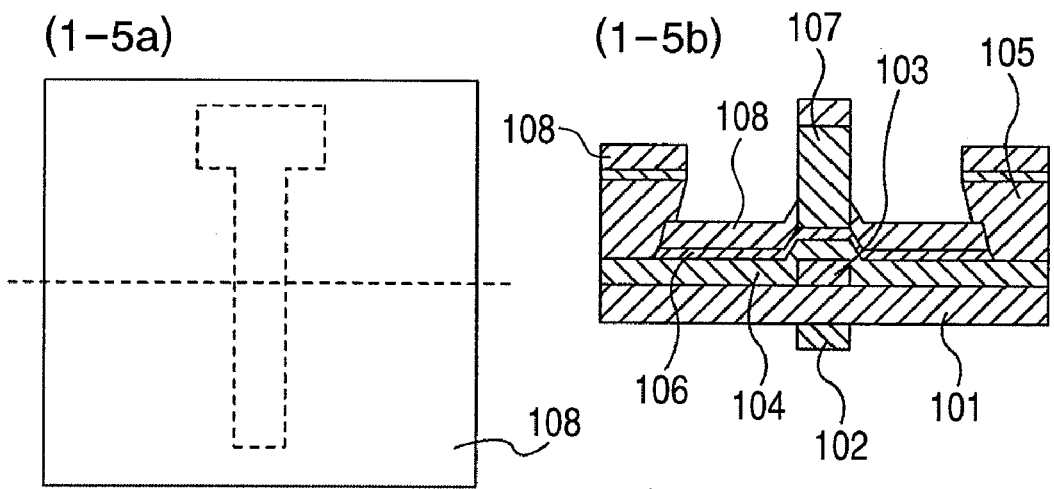
Figure 2:
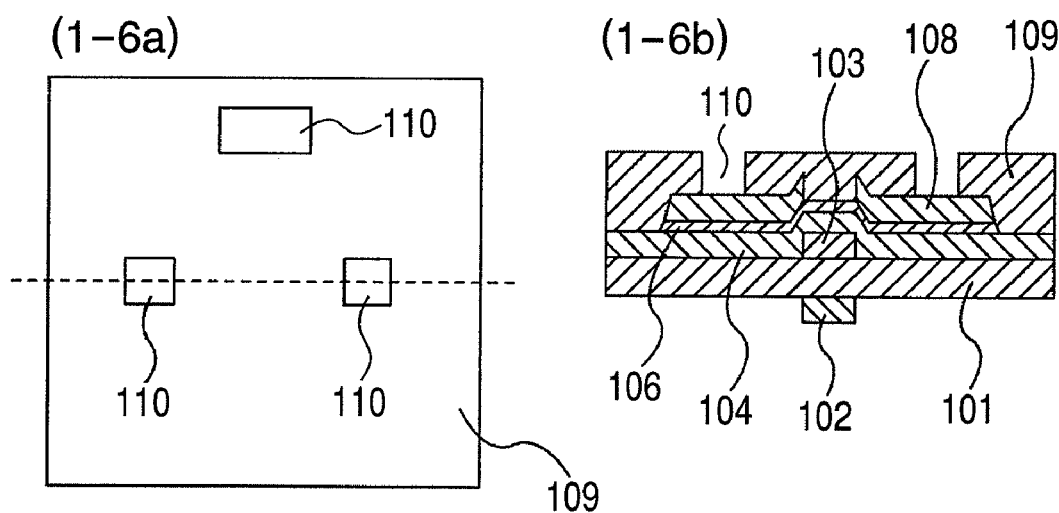

As shown in a sectional view (1-1b) of FIG. 1, the light blocking film 102 is first formed on the rear side of the substrate 101. Then, the light blocking film 102 is shaped into a desired form as a photomask for a gate electrode by photolithography and etching.

The substrate 101 may be made of glass, quartz, or plastic (synthetic resin) such as polyethylene terephthalate, polyethylene naphthalate, polyether imide, polyacrylate polyimide, polycarbonate, cellulose triacetate or cellulose acetate propionate.

The light blocking film 102 may be formed from an element selected from chromium (Cr), nickel (Ni), tantalum (Ta), tungsten (W), titanium (Ti), molybdenum (Mo), niobium (Nb) and aluminum (Al), or an alloy material or compound material comprising one of these elements as the main component.

Thereafter, as shown in a sectional view (1-1b) of FIG. 1, a conductive film for the gate electrode 103 having a thickness of 20 to 200 nm is formed on the front side of the substrate 101 by sputtering, plasma enhanced CVD (PECVD), pulsed laser deposition (PLD) or coating. Since a dense film can be formed at a low temperature by sputtering or plasma enhanced CVD (PECVD), these processes are widely used for industrial purposes. The conductive film for the gate electrode 103 may be made of an oxide material such as In—Zn—O, Al—Zn—O, Ga—Zn—O, B—Zn—O, ZnO and ITO (Indium Tin Oxide).

In this embodiment, a conductive film for the gate electrode 103 having a thickness of 50 nm is formed from ITO by sputtering at a gas pressure of 0.5 Pa (Ar+2% $O_2$), a DC power of 50 W and a growth temperature (room temperature).

A positive resist is applied to the conductive film for the gate electrode 103 and patterned into a desired form by photolithography through the exposure of the rear side of the substrate and etching using the light blocking film 102 formed on the rear side of the substrate as a photomask to form the gate electrode 103 as shown in a sectional view (1-1b) of FIG. 1. Refer to a top view in FIG. 1(1-1a) and a sectional view in FIG. 1(1-1b).

Then, a gate insulating film 104 covering the gate electrode 103 is formed to a thickness of about 50 to 500 nm. Refer to a top view in FIG. 1(1-2a) and a sectional view in FIG. 1(1-2b).

The gate insulating film 104 is obtained by forming one or more oxide films made of silicon oxide or nitride, aluminum oxide or nitride, yttrium oxide, hafnium oxide or YSZ by sputtering or plasma enhanced CVD (PECVD).

In this embodiment, a gate insulating film 104 having a thickness of 100 nm is formed from silicon oxide ($SiO_x$) by sputtering at a gas pressure of 0.5 Pa (Ar+2% $O_2$), an RF power of 50 W and a growth temperature (200° C.). Refer to a top view in FIG. 1(1-2a) and a sectional view in FIG. 1(1-2b).

Then, a negative resist 105 is applied to form a lift-off pattern covering the periphery of an area including source and drain electrodes 108 and a channel layer 106 by photolithography through the exposure of the front side of the substrate. Refer to a top view in FIG. 1(1-3a) and a sectional view in FIG. 1(1-3b).

Thereafter, a channel layer 106 having a thickness of about 5 to 70 nm is formed. The channel layer 106 is formed from $In_xGa_yZn_{1-x-y}O$, ZnO or $Zn_xSn_{1-x}O$ on the gate insulating film 104 and the negative resist 105 by sputtering or pulsed laser deposition (PLD).

To improve the performance of the oxide semiconductor transistor, the oxide semiconductor may be annealed after its formation. In this embodiment, a channel layer having a thickness of 25 nm is formed from $In_xGa_yZn_{1-x-y}O$ by sputtering at a gas pressure of 0.5 Pa (Ar+2% $O_2$), an RF power of 50 W and a growth temperature (room temperature).

Then, a positive resist 107 is applied to form a lift-off pattern by photolithography through the exposure of the rear side of the substrate. Refer to a top view in FIG. 2(1-4a) and a sectional view in FIG. 2(1-4b).

Thereafter, a conductive film for the source and drain electrodes 108 having a thickness of about 20 to 200 nm is formed from the same material as that of the conductive film for the gate electrode 103 by the same film forming method as that of the conductive film. Refer to a top view in FIG. 2(1-5a) and a sectional view in FIG. 2(1-5b).

In this embodiment, a conductive film for the source and drain electrodes 108 having a thickness of 70 nm is formed from ITO by sputtering at a gas pressure of 0.5 Pa (Ar+2% $O_2$), a DC power of 50 W and a growth temperature (room temperature). Refer to a top view in FIG. 2(1-5a) and a sectional view in FIG. 2(1-5b).

Then, the positive resist 107, the negative resist 105, the channel layer film 106 on the resist and the conductive film for the source and drain electrodes 108 on the resist are removed by a lift-off process. Self-alignment between the lower electrode 103 and the upper electrodes 108 can be carried out by the above process.

Then, a passivation film 109 having a thickness of about 50 to 500 nm is formed from the same material as that of the gate insulating film 104 by the same film forming method as that of the gate insulating film 104. In this embodiment, a passivation film 109 having a thickness of 100 nm is formed from silicon oxide ($SiO_x$) by sputtering at a gas pressure of 0.5 Pa (Ar+12% $O_2$), an RF power of 50 W and a growth temperature (room temperature). Refer to a top view in FIG. 2(1-6a) and a sectional view in FIG. 2(1-6b).

After a resist is applied, through holes 110 for wirings for electrically interconnecting the wirings 111, the gate electrode 103 and the source and drain electrodes 108 are formed in the passivation film 109 by photolithography through the exposure of the front side of the substrate and etching. Refer to a top view in FIG. 2(1-6a) and a sectional view in FIG. 2(1-6b).

Then, a conductive film for the wirings 111 having a thickness of about 20 to 500 nm is formed from the same material as that of the conductive film for the gate electrode 103 by the same film forming method as that of the conductive film. In this embodiment, a conductive film for the wirings 111 having a thickness of 100 nm is formed from ITO by sputtering at a gas pressure of 0.5 Pa (Ar+2% $O_2$), a DC power of 50 W and a growth temperature (room temperature).

Thereafter, a resist mask is formed on the conductive film for the wirings 111 by photolithography and used to pattern the conductive film for the wirings 111 into a desired form so as to form the wirings 111. Refer to a top view in FIG. 3(1-7a) and a sectional view in FIG. 3(1-7b).

Then, the light blocking film 102 formed on the rear side of the substrate 101 is removed by chemical etching or the like to form a transparent thin film transistor. When the mobility of this transistor was measured, it was 12.2 $cm^2/Vs$. Refer to a top view in FIG. 3(1-8a) and a sectional view in FIG. 3(1-8b).

Figure 3:
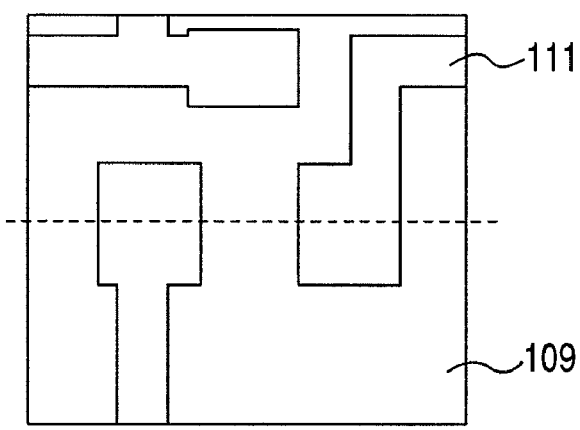
FIGS. 3(1-7a) and 3(1-8a) are top views, FIGS. 3(1-7b) and 3(1-8b) are sectional views, and FIG. 3(1-9) is a wiring diagram in the manufacturing method of the first embodiment.
Figure 3:
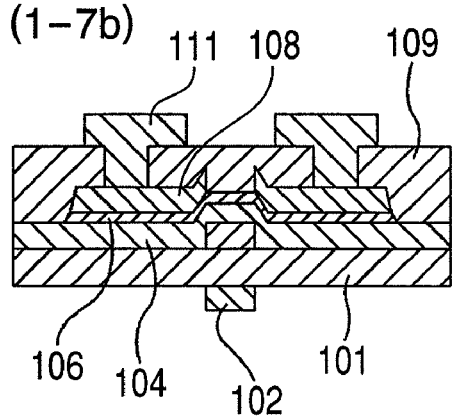
Figure 3:
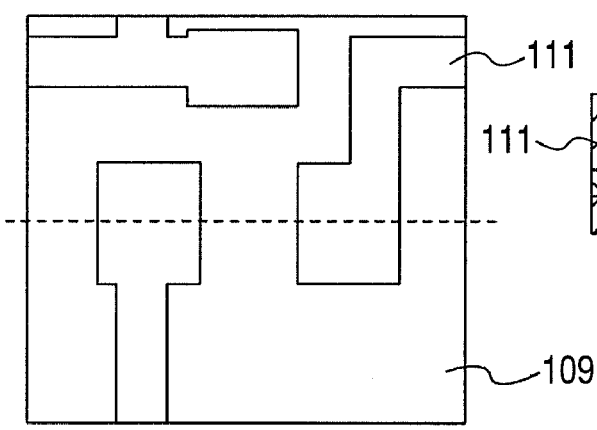
Figure 3:
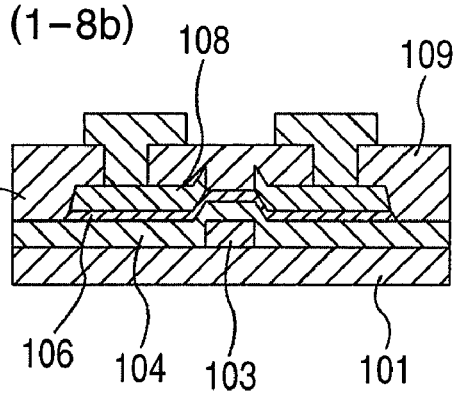
Figure 3:
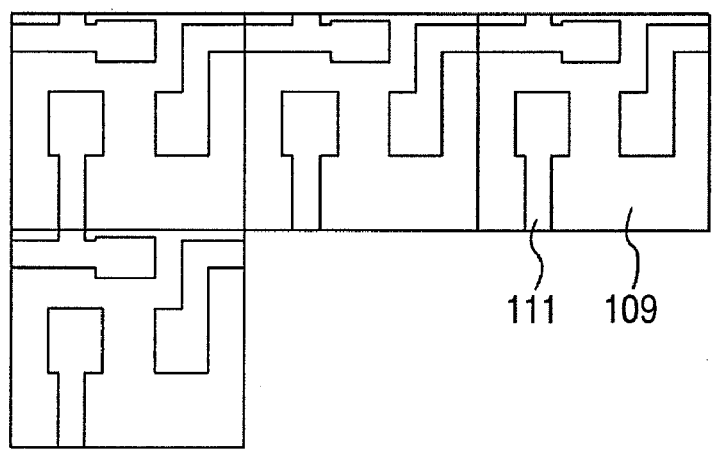

When this transistor is to be used in a field effect transistor array, the devices can be connected as shown in the wiring diagram in FIG. 3(1-9).

When the transmittances of the substrate 101, the gate electrode 103, the gate insulating film 104 and the source and drain electrodes 108, the channel layer 106, the wiring layer ill and the passivation film 109 were measured, it was confirmed that they were 80% or more at a visible range.

Second Embodiment

Figure 4:
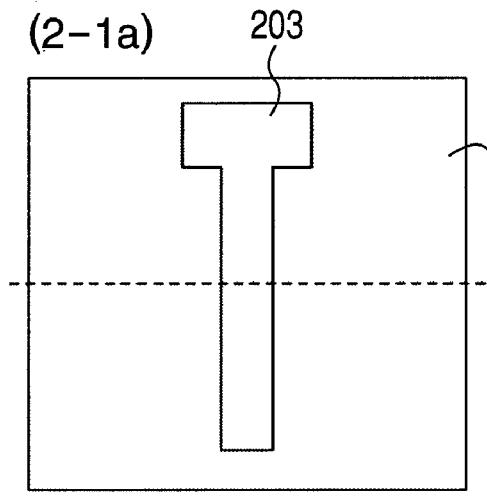
FIGS. 4(2-1a), 4(2-2a) and 4(2-3a) are top views, and FIGS. 4(2-1b), 4(2-2b) and 4(2-3b) are sectional views in the manufacturing method of a second embodiment.
Figure 4:
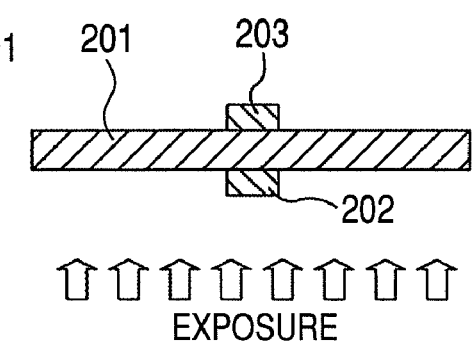
Figure 4:
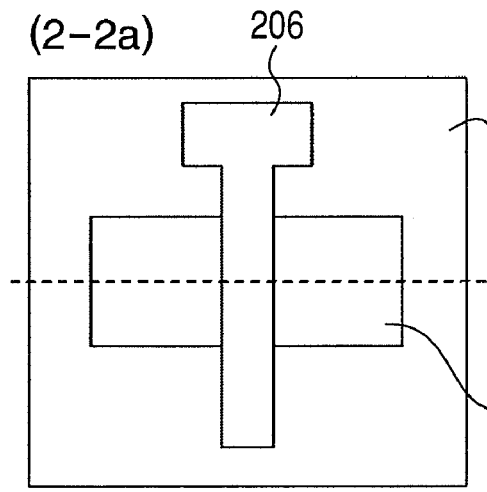
Figure 4:
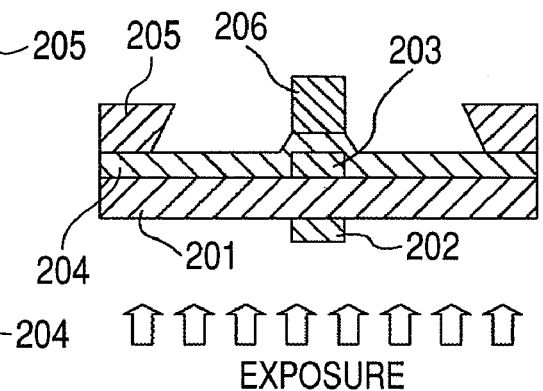
Figure 4:
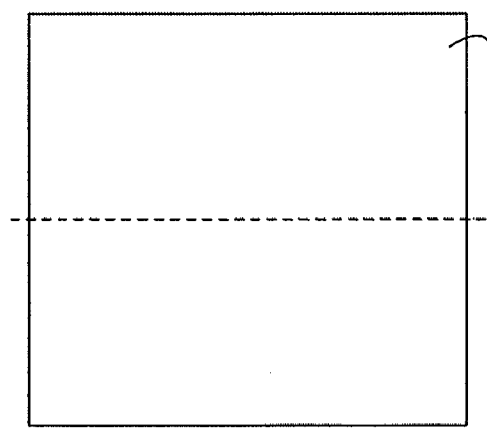
Figure 4:
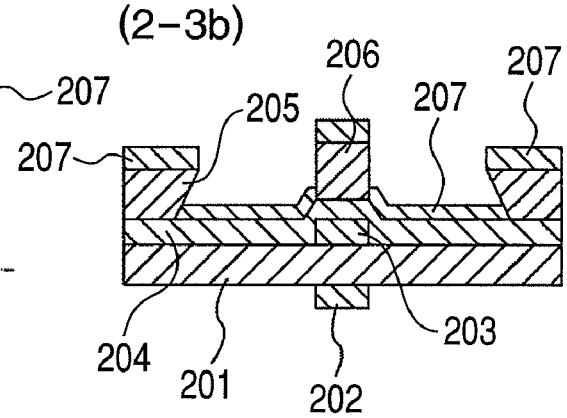

A second embodiment of the method of manufacturing an oxide semiconductor thin film transistor according to the present invention will be described with reference to FIGS. 4(2-1a) to 6(2-8).

The method of manufacturing an oxide semiconductor device of this embodiment is for a bottom gate/bottom contact structure characterized in that the pattern of a light blocking film 202 on the rear side of a substrate 201 is a positive pattern for a gate electrode 203.

First, the same method as in the first embodiment is employed to form up to a gate insulating layer 204. Refer to a top view in FIG. 4(2-2a) and a sectional view in FIG. 4(2-2b). Then, a negative resist 205 is applied to form a lift-off pattern covering the periphery of an area including source and drain electrodes 207 and a channel layer 208 by photolithography through the exposure to the rear side of the substrate. Then, a positive resist 206 is applied to form a lift-off pattern by photolithography through the exposure of the rear side of the substrate. Refer to a top view in FIG. 4(2-2a) and a sectional view in FIG. 4(2-2b).

Then, source and drain electrodes 207 having a thickness of about 20 to 200 nm are formed from the same material as that of the conductive film for the gate electrode 103 by the same film forming method as that of the conductive film in the first embodiment. In this embodiment, a conductive film for the source and drain electrodes 207 having a thickness of 70 nm is formed from ITO by sputtering at a gas pressure of 0.5 Pa (Ar+2% $O_2$), a DC power of 50 W and a growth temperature (room temperature). Refer to a top view in FIG. 4(2-3a) and a sectional view in FIG. 4(2-3b).

Then, the positive resist 206, the negative resist 205 and the conductive film for the source and drain electrodes 207 on these resists are removed by the lift-off process. Self-alignment between the lower electrode 203 and the upper electrodes 207 can be carried out by the above process.

A channel layer 208 having a thickness of about 5 to 70 nm is then formed. The channel layer 208 is formed from $In_xGa_yZn_{1-x-y}O$ or $Zn_xSn_{1-x}O$ by sputtering or pulsed laser deposition (PLD). To improve the performance of the oxide semiconductor transistor, the oxide semiconductor may be annealed after its formation. In this embodiment, a channel layer having a thickness of 25 nm is formed from $In_xGa_yZn_{1-x-y}O$ by sputtering at a gas pressure of 0.5 Pa (Ar+2% $O_2$), an RF power of 50 W and a growth temperature (room temperature). After a resist is applied, the channel layer 208 is patterned into a desired form by photolithography through the exposure of the front side of the substrate and etching. Refer to a top view in FIG. 5(2-4a) and a sectional view in FIG. 5(2-4b).

Figure 5:
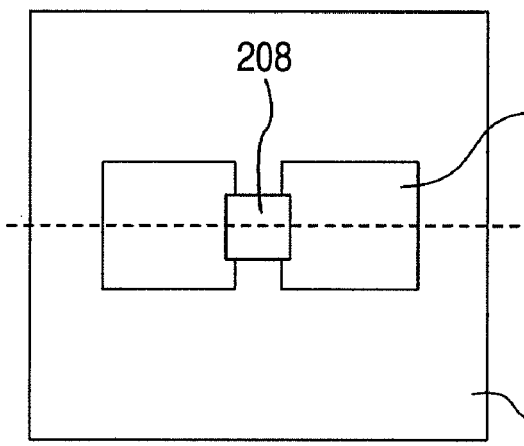
FIGS. 5(2-4a), 5(2-5a) and 5(2-6a) are top views, and FIGS. 5(2-4b), 5(2-5b) and 5(2-6b) are sectional views in the manufacturing method of the second embodiment.
Figure 5:
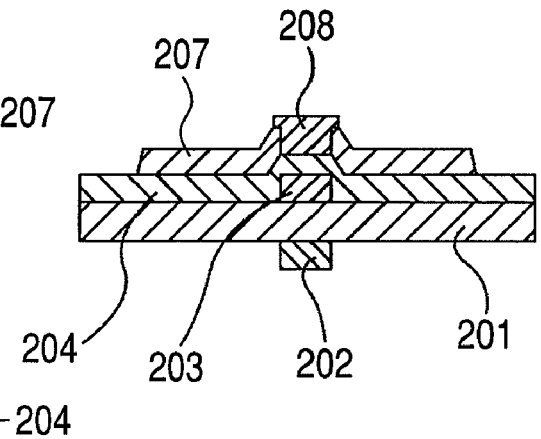
Figure 5:
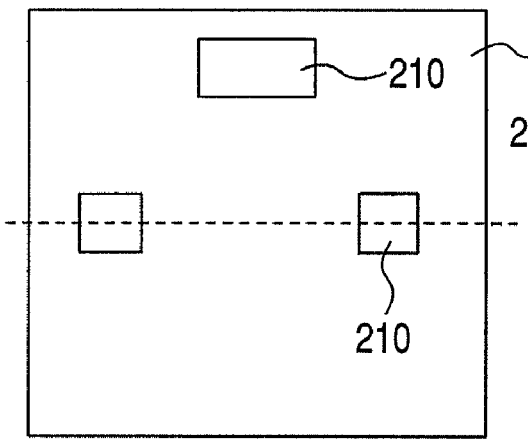
Figure 5:
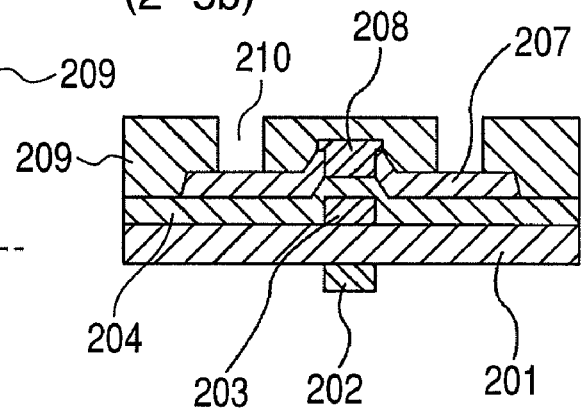
Figure 5:
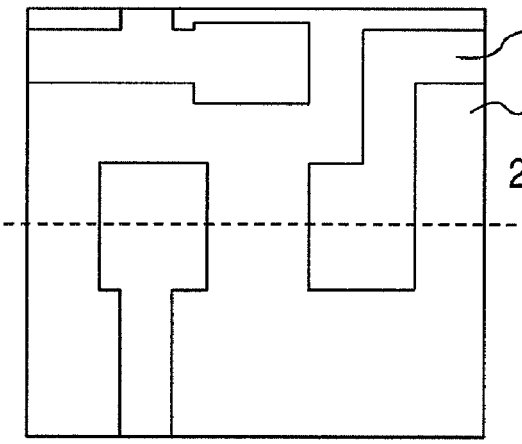
Figure 5:
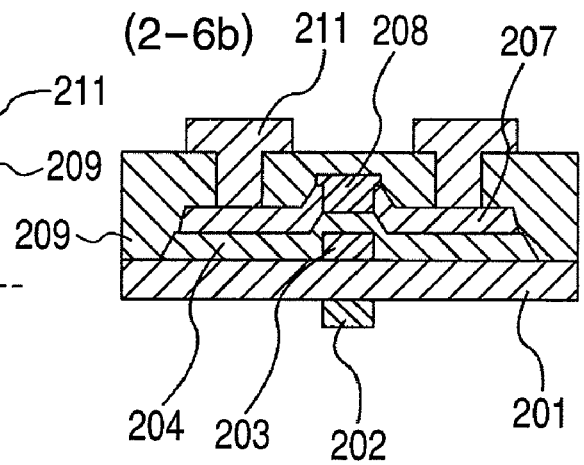

Thereafter, the formation of a passivation film 209, the formation of through holes 210 for electrodes (a top view in FIG. 5(2-5a) and a sectional view in FIG. 5(2-5b)), the formation of wirings 211 (a top view in FIG. 5(2-6a) and a sectional view in FIG. 5(2-6b)) and the removal of the light blocking film 202 are carried out in the same manner as in the first embodiment to form a transparent transistor. Refer to a top view in FIG. 5(2-7a) and a sectional view in FIG. 5(2-7b)

Figure 6:
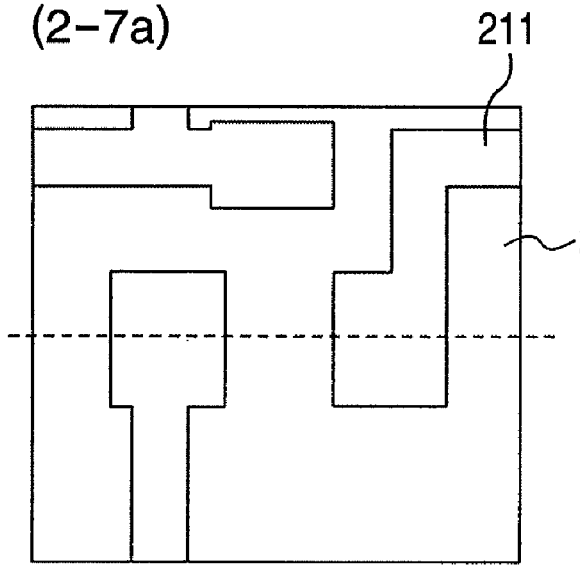
FIG. 6 6(2-7a) is a top view, FIG. 6(2-7b) is a sectional view, and FIG. 6(2-8) is a wiring diagram in the manufacturing method of the second embodiment.
Figure 6:
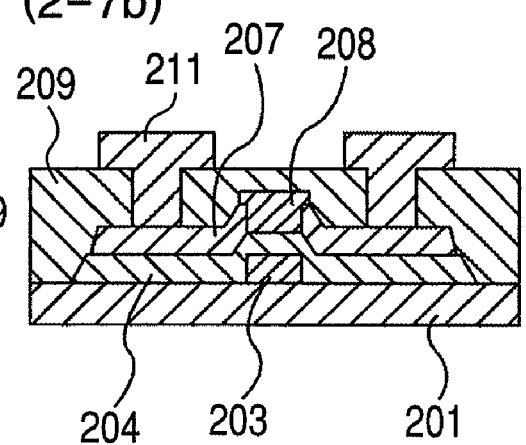
Figure 6:
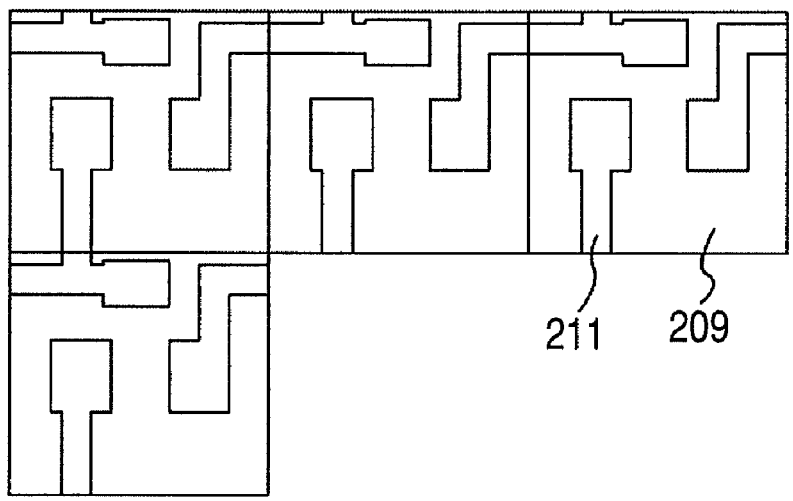

When the mobility of this transistor was measured, it was 9.9 $cm^2$/Vs. When this device is to be used in a field effect transistor array, the field effect transistor array can be constructed by connecting the devices as shown in FIG. 6(2-8), for example.

When the transmittances of the substrate 201, the gate electrode 203, the gate insulating film 204, the source and drain electrodes 207, the channel layer 208, the wiring layer 211 and the passivation film 209 were measured, it was confirmed that they were 80% or more at a visible range.

Third Embodiment

Figure 7:
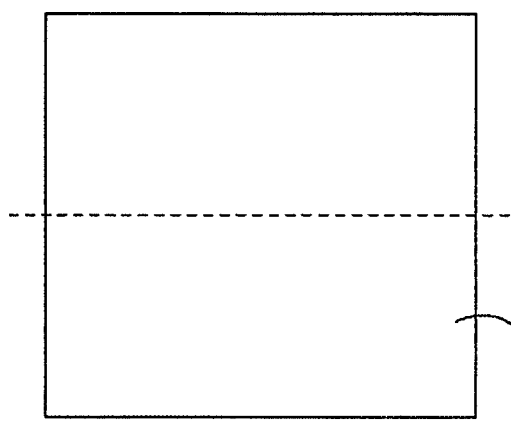
FIGS. 7(3-1a), 7(3-2a) and 7(3-3a) are top views, and FIGS. 7(3-1b), 7(3-2b) and 7(3-3b) are sectional views in the manufacturing method of a third embodiment.
Figure 7:
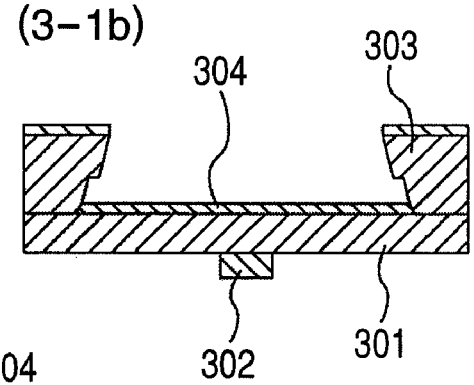
Figure 7:
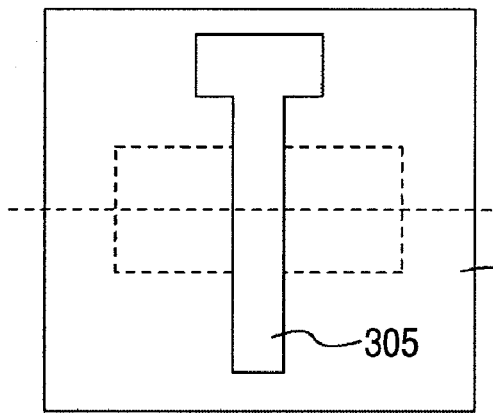
Figure 7:
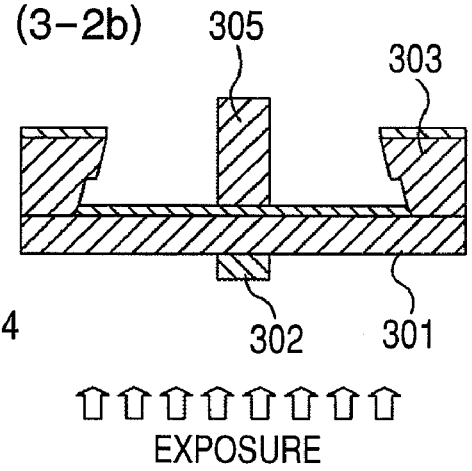
Figure 7:
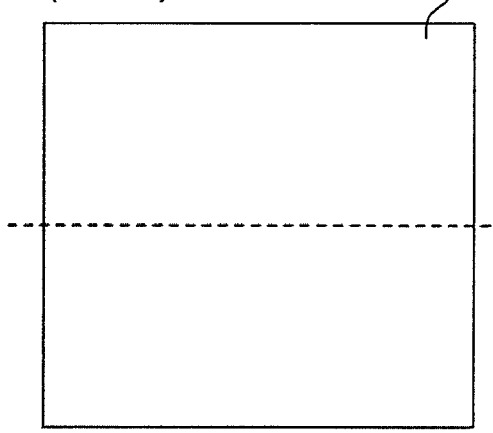
Figure 7:
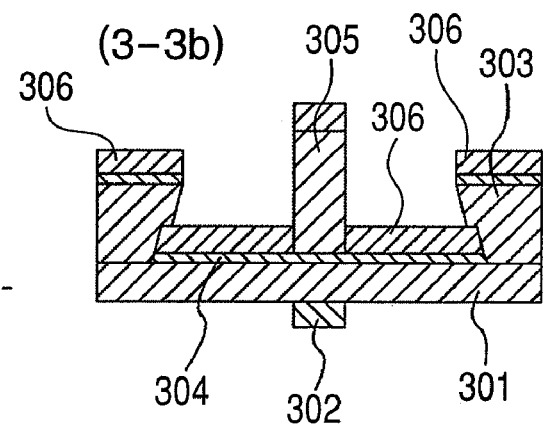

A third embodiment of the method of manufacturing an oxide semiconductor thin film transistor according to the present invention will be described with reference to FIGS. 7(3-1a) to 9(3-9). The method of manufacturing an oxide semiconductor device of this embodiment is for a top gate/top contact structure characterized in that the pattern of a light blocking film 302 on the rear side of a substrate 301 is a positive pattern for a gate electrode 308.

First, a light blocking film 302 is formed on the rear side of the substrate 301 in the same manner as in the first embodiment. Then, a negative resist 303 is applied to form a lift-off pattern covering the periphery of an area including source and drain electrodes 306 and a channel layer 304 by photolithography through the exposure of the front side of the substrate.

Then, the channel layer 304 having a thickness of about 5 to 70 nm is formed. The channel layer 304 is formed from $In_xGa_yZn_{1-x-y}O$, ZnO or $Zn_xSn_{1-x}O$ by sputtering or pulsed laser deposition (PLD). To improve the performance of the oxide semiconductor transistor, the oxide semiconductor may be annealed after its formation. In this embodiment, a channel layer 304 having a thickness of 25 nm is formed from $In_xGa_yZn_{1-x-y}O$ by sputtering at a gas pressure of 0.5 Pa (Ar+2% $O_2$), an RF power of 50 W and a growth temperature (room temperature). Refer to a top view in FIG. 7(3-1a) and a sectional view in FIG. 7(3-1b).

Then, a positive resist 305 is applied to form a lift-off pattern by photolithography through the exposure of the rear side of the substrate. Refer to a top view in FIG. 7(3-2a) and a sectional view in FIG. 7(3-2b).

Then, a conductive film for the source and drain electrodes 306 having a thickness of about 20 to 200 nm is formed from the same material as that of the conductive film for the gate electrode 103 by the same film forming method as that of the conductive film in the first embodiment. In this embodiment, a conductive film for the source and drain electrodes 306 having a thickness of 70 nm is formed from ITO by sputtering at a gas pressure of 0.5 Pa (Ar+2% $O_2$), a DC power of 50 W and a growth temperature (room temperature). Refer to a top view in FIG. 7(3-3a) and a sectional view in FIG. 7(3-3b).

Figure 8:
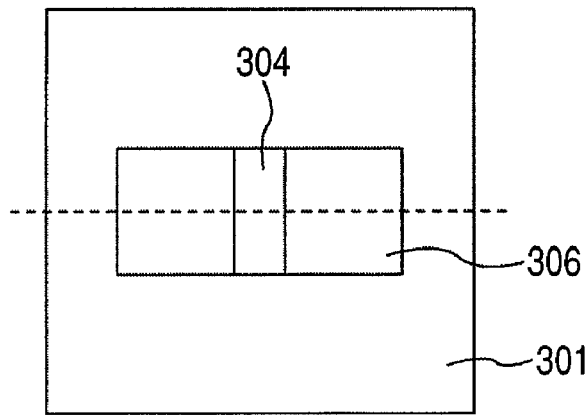
FIGS. 8(3-4a), 8(3-5a) and 8(3-6a) are top views, and FIGS. 8(3-4b), 8(3-5b) and 8(3-6b) are sectional views in the manufacturing method of the third embodiment.
Figure 8:
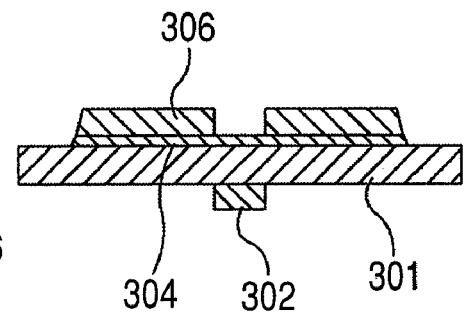
Figure 8:
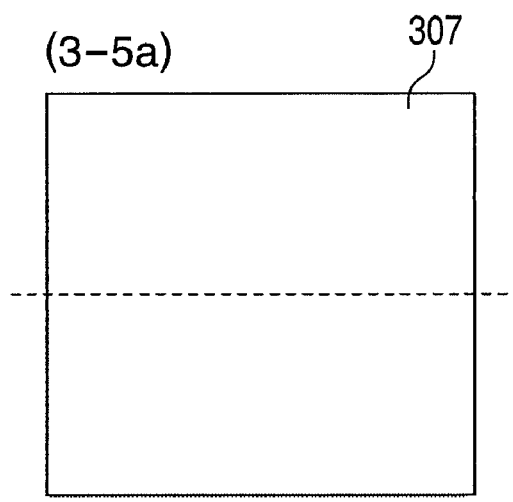
Figure 8:
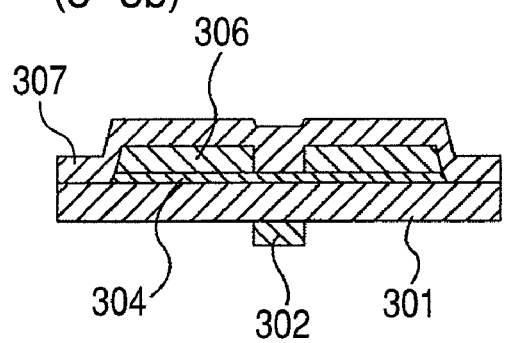
Figure 8:
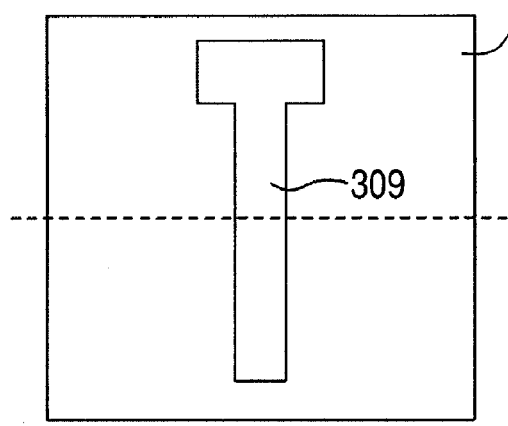
Figure 8:
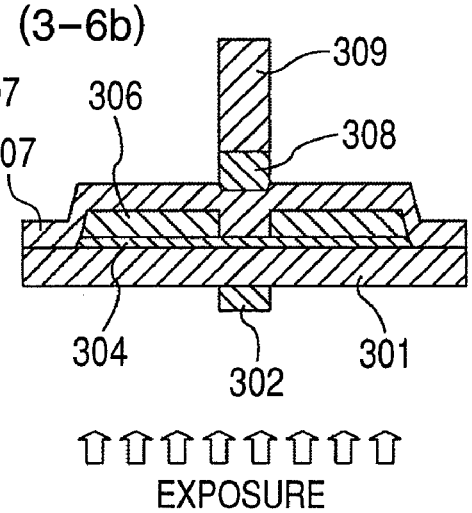

Then, the positive resist 305, the negative resist 303 and the conductive film for the source and drain electrodes 306 on these resists are removed by the lift-off process. Refer to a top view in FIG. 8(3-4a) and a sectional view in FIG. 8(3-4b).

Then, a gate insulating film 307 for electrically isolating the lower electrodes 306 and an upper electrode 308 is formed to a thickness of about 50 to 500 nm in the same manner as in the first embodiment. In this embodiment, a gate insulating film 307 having a thickness of 100 nm is formed from silicon oxide ($SiO_x$) by sputtering at a gas pressure of 0.5 Pa (Ar+ 10% $O_2$), an RF power of 50 W and a growth temperature (200° C.). Refer to a top view in FIG. 8(3-5a) and a sectional view in FIG. 8(3-5b).

Then, a conductive film for the gate electrode 308 having a thickness of 20 to 500 nm is formed in the same manner as in the first embodiment. In this embodiment, a conductive film for the gate electrode 308 having a thickness of 70 nm is formed from ITO by sputtering ITO at a gas pressure of 0.5 Pa (Ar+2% $O_2$), a DC power of 50 W and a growth temperature (room temperature). After a positive resist is applied, the gate electrode 308 is formed by photolithography through the exposure of the rear side of the substrate 301 and etching using the light blocking film 302 as a photomask, thereby making it possible to carry out self-alignment between the lower electrodes 306 and the upper electrode 308. Refer to a top view in FIG. 8(3-6a) and a sectional view in FIG. 8(3-6b).

After the removal of the resist 309, a resist is applied, and through holes 310 for wirings for electrically interconnecting the wirings and the lower electrodes 306 are formed in the insulating film 307 by photolithography through the exposure of the front side of the substrate and etching. Refer to a top view in FIG. 9(3-7a) and a sectional view in FIG. 9(3-7b).

Then, a conductive film for the wirings 311 having a thickness of about 20 to 500 nm is formed in the same manner as in the first embodiment. In this embodiment, a conductive film for the wirings 311 having a thickness of 100 nm is formed from ITO by sputtering at a gas pressure of 0.5 Pa (Ar+2% $O_2$), a DC power of 50 W and a growth temperature (room temperature). Thereafter, a resist mask is formed on the conductive film for the wirings 311 by photolithography and used to pattern the conductive film for the wirings 311 into a desired form so as to form the wirings 311. Then, the light blocking film is removed in the same manner as in the first embodiment to form a transparent transistor. When the mobility of this transistor was measured, it was 10.8 cm$^2$/Vs. Refer to a top view in FIG. 9(3-8a) and a sectional view in FIG. 9(3-8b).

Figure 9:
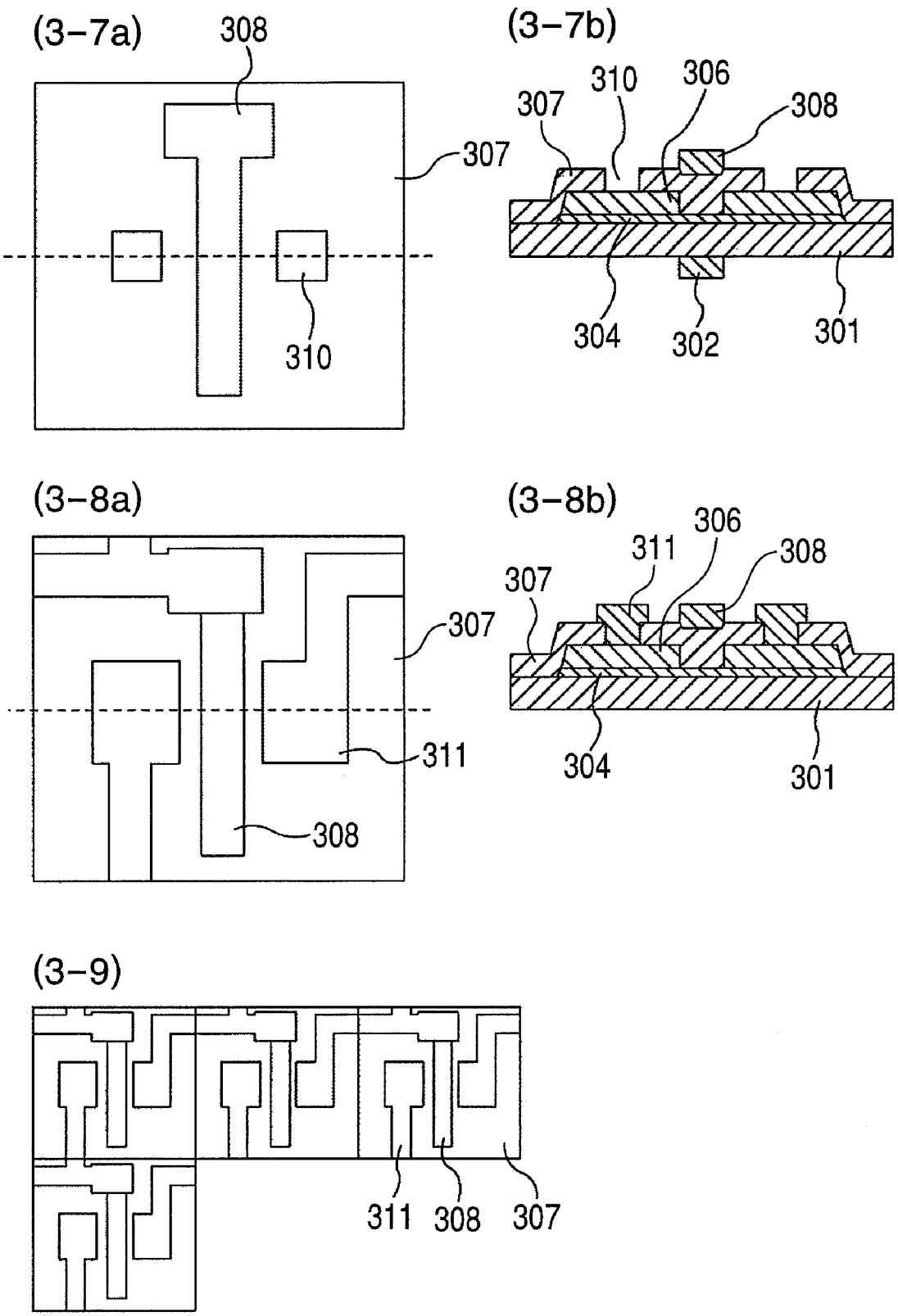
FIGS. 9(3-7a) and 9(3-8a) are top views, FIGS. 9(3-7b) and 9(3-8b) are sectional views, and FIG. 9(3-9) is a wiring diagram in the manufacturing method of the third embodiment.

When this field transistor is to be used in a transistor array, the transistor array can be constructed by connecting the devices as shown in FIG. 9(3-9), for example.

When the transmittances of the substrate 301, the gate electrode 308, the gate insulating film 307, the source and drain electrodes 306, the channel layer 304 and the wiring layer 311 were measured, it was confirmed that they were 80% or more at a visible range.

Fourth Embodiment

Figure 10:
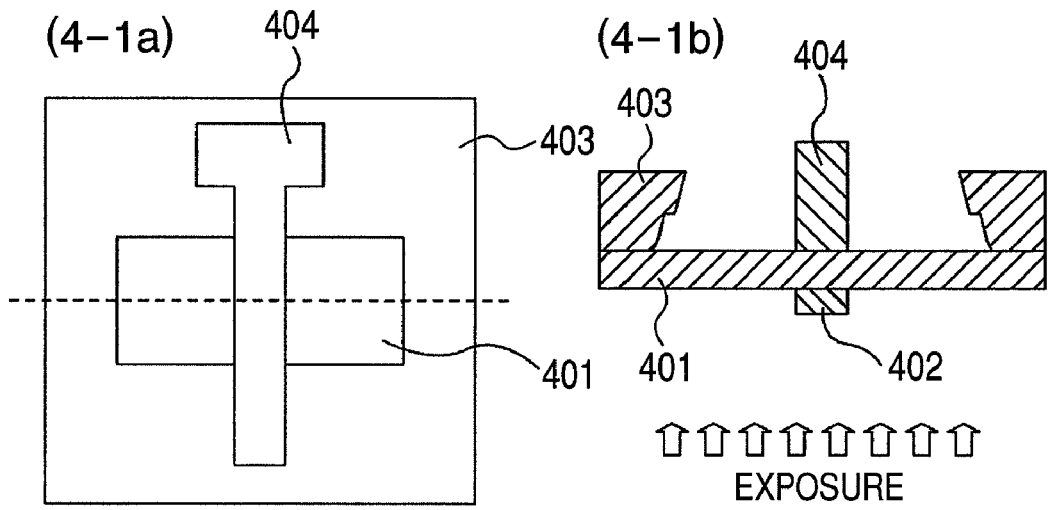
FIGS. 10(4-1a), 10(4-2a) and 10(4-3a) are top views, and FIGS. 10(4-1b), 10(4-2b) and 10(4-3b) are sectional views in the manufacturing method of a fourth embodiment.
Figure 10:
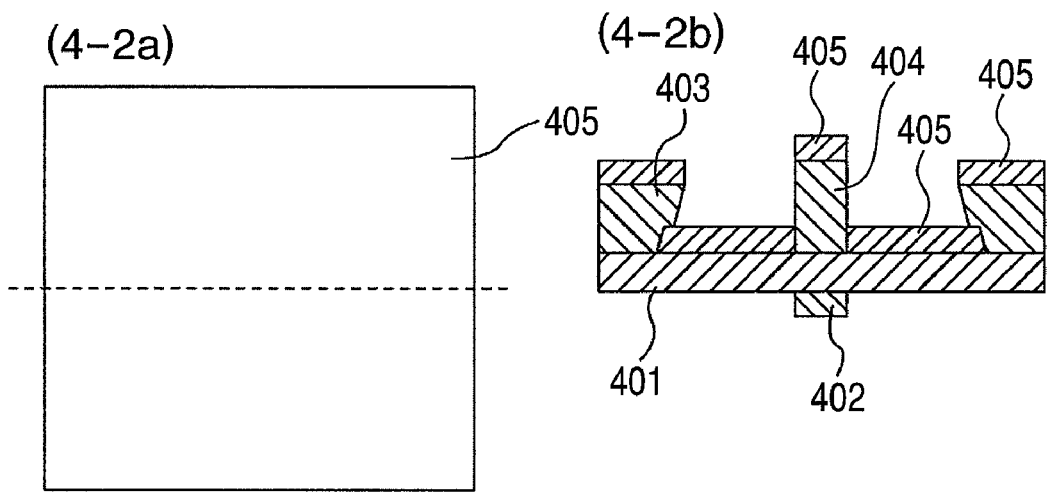
Figure 10:
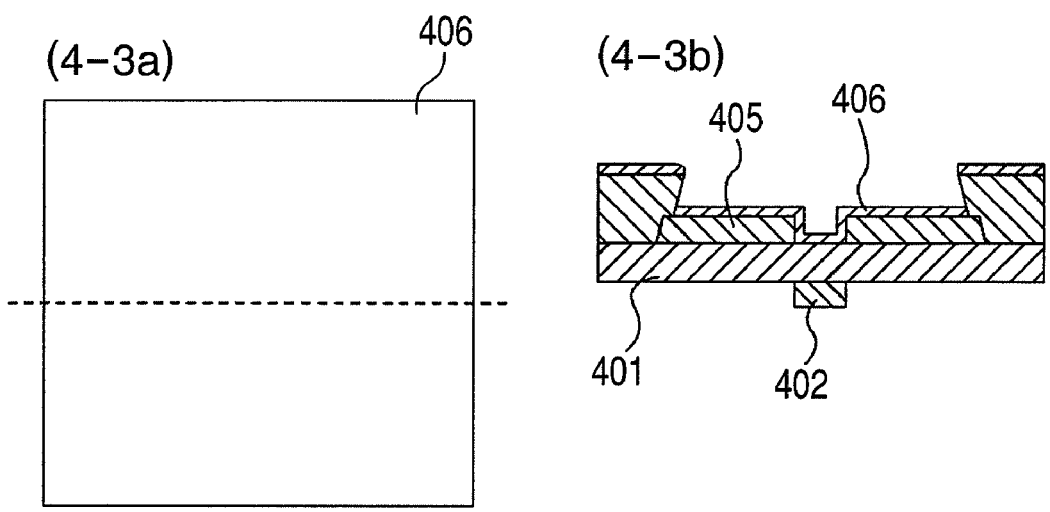

A fourth embodiment of the method of manufacturing an oxide semiconductor thin film transistor according to the present invention will be described with reference to FIGS. 10(4-1a) to 12(4-9a).

The method of manufacturing an oxide semiconductor thin film transistor of this embodiment is for a top gate/bottom contact structure characterized in that the pattern of a light blocking film 402 on the rear side of a substrate 401 is a positive pattern for a gate electrode 408.

First, the light blocking film 402 is formed on the rear side of the substrate 401 in the same manner as in the first embodiment. Then, a negative resist 403 is applied to form a lift-off pattern covering the periphery of an area including source and drain electrodes 405 and a channel layer 406 by photolithography through the exposure of the front side of the substrate. Subsequently, a positive resist 404 is applied to form a lift-off pattern by photolithography for the exposure of the rear side of the substrate. Refer to a top view in FIG. 10(4-1a) and a sectional view in FIG. 10(4-1b).

Then, the source and drain electrodes 405 having a thickness of about 20 to 200 nm are formed from the same material as that of the conductive film for the gate electrode 103 by the same film forming method as that of the conductive film in the first embodiment. In this embodiment, a conductive film for the source and drain electrodes 405 having a thickness of 70 nm is formed from ITO by sputtering at a gas pressure of 0.5 Pa (Ar+2% O$_2$), a DC power of 50 W and a growth temperature (room temperature). Refer to a top view in FIG. 10(4-2a) and a sectional view in FIG. 10(4-2b).

Then, the positive resist 404, the negative resist 403 and the conductive film for the source and drain electrodes 405 on these resists are removed by the lift-off process. Thereafter, a negative resist 403 is applied to form a lift-off pattern covering the periphery of an area including the source and drain electrodes 405 and the channel layer 406 by photolithography through the exposure of the front side of the substrate.

Thereafter, the channel layer 406 having a thickness of about 5 to 70 nm is formed. The channel layer 406 is formed from In$_x$Ga$_y$Zn$_{1-x-y}$O or Zn$_x$Sn$_{1-x}$O by sputtering or pulsed laser deposition (PLD). To improve the performance of the oxide semiconductor transistor, the oxide semiconductor may be annealed after its formation. In this embodiment, a channel layer 406 having a thickness of 25 nm is formed from In$_x$Ga$_y$Zn$_{1-x-y}$O by sputtering at a gas pressure of 0.5 Pa (Ar+2% O$_2$), an RF power of 50 W and a growth temperature (room temperature). Refer to a top view in FIG. 10(4-3a) and a sectional view in FIG. 10(4-3b).

Figure 11:
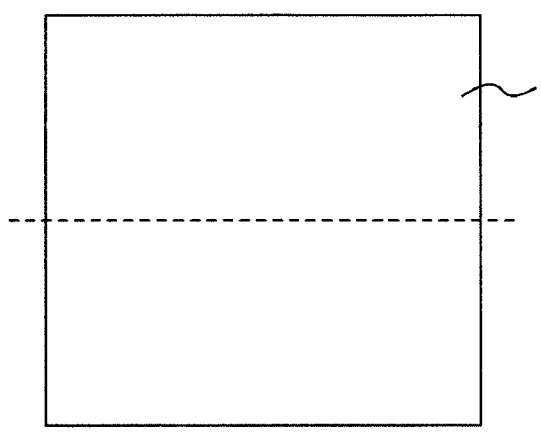
FIGS. 11(4-4a), 11(4-5a) and 11(4-6a) are top views, and FIGS. 11(4-4b), 11(4-5b) and 11(4-6b) are sectional views in the manufacturing method of the fourth embodiment.
Figure 11:
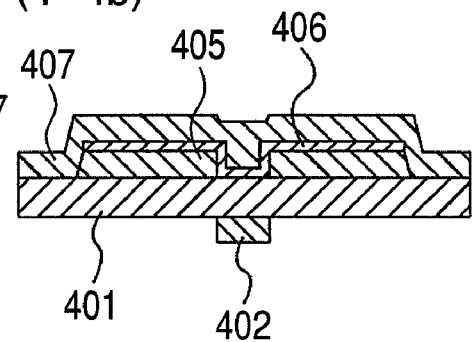
Figure 11:
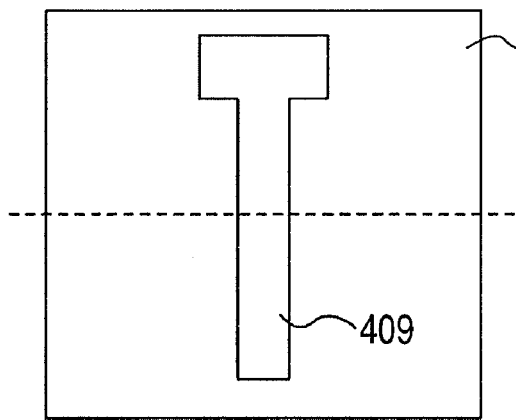
Figure 11:
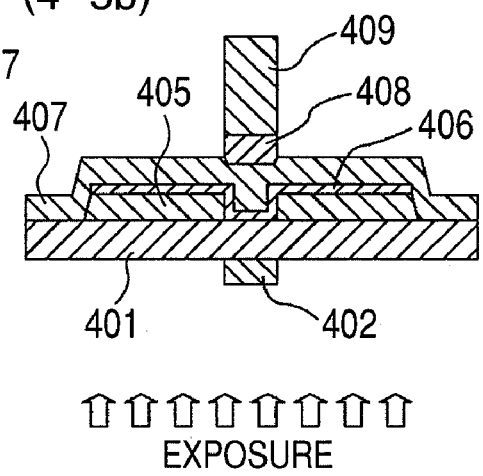
Figure 11:
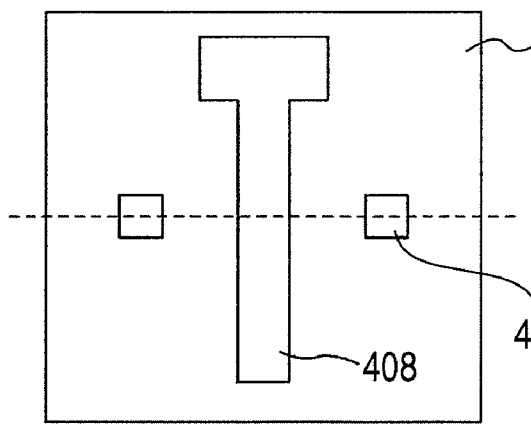
Figure 11:
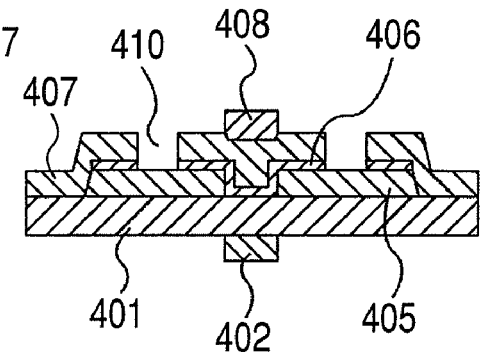

The negative resist 403 and the channel layer 406 on the resist are then removed by the lift-off process. A gate insulating film 407 for electrically isolating the lower electrodes 405 and an upper electrode 408 is formed to a thickness of about 50 to 500 nm in the same manner as in the first embodiment. In this embodiment, a gate insulating film 407 having a thickness of 100 nm is formed from silicon oxide (SiO$_x$) by sputtering at a gas pressure of 0.5 Pa (Ar+10% O$_2$), an RF power of 50 W and a growth temperature (200° C.). Refer to a top view in FIG. 11(4-4a) and a sectional view in FIG. 11(4-4b).

Thereafter, a gate electrode 408 having a thickness of 20 to 200 nm is formed in the same manner as in the first embodiment. In this embodiment, a conductive film for the gate electrode 408 having a thickness of 70 nm is formed from ITO by sputtering at a gas pressure of 0.5 Pa (Ar+2% O$_2$), a DC power of 50 W and a growth temperature (room temperature). After a positive resist 409 is applied, the conductive film for the gate electrode 408 is patterned into a desired form by photolithography through the exposure of the rear side of the substrate and etching to form the gate electrode 408. Self-alignment between the lower electrodes 405 and the upper electrode 408 can be carried out by the above process. Refer to a top view in FIG. 11(4-5a) and a sectional view in FIG. 11(4-5b).

After the resist 409 is removed, through holes 410 for wirings for interconnecting the wirings 411 and the lower electrodes 405 are formed by photolithography through the exposure of the front side of the substrate and etching in the same manner as in the third embodiment. Refer to a top view in FIG. 11(4-6a) and a sectional view in FIG. 11(4-6b).

Then, a conductive film for the wirings 411 having a thickness of about 20 to 500 nm is formed in the same manner as in the first embodiment. In this embodiment, a conductive film for the wirings 411 having a thickness of 100 nm is formed from ITO by sputtering at a gas pressure of 0.5 Pa (Ar+2% O$_2$), a DC power of 50 W and a growth temperature (room temperature). Then, a resist mask is formed on the conductive film for the wirings 411 by photolithography and used to pattern the conductive film for the wirings 411 into a desired form so as to form the wirings 411. Refer to a top view in FIG. 12(4-7a) and a sectional view in FIG. 12(4-7b).

Then, the light blocking film 402 is removed in the same manner as in the first embodiment. Thereby, a transparent transistor is formed. When the mobility of this transistor was measured, it was 10.6 cm$^2$/Vs. Refer to a top view in FIG. 12(4-8a) and a sectional view in FIG. 12(4-8b).

Figure 12:
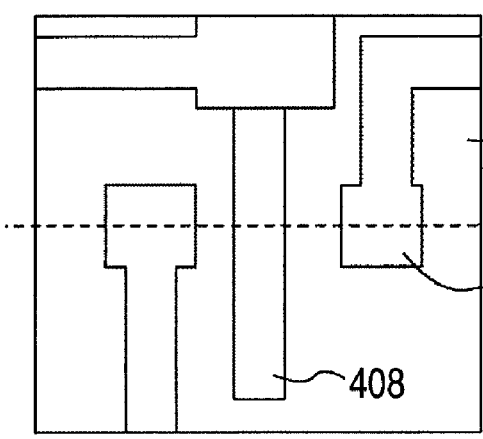
FIGS. 12(4-7a) and 12(4-8a) are top view, FIGS. 12(4-7b) and 12(4-8b) are sectional views, and FIG. 12(4-9a) is a wiring diagram in the manufacturing method of the fourth embodiment.
Figure 12:
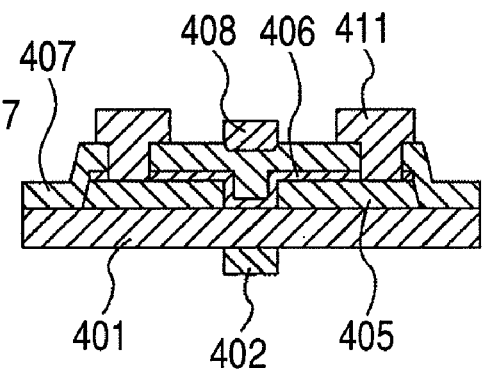
Figure 12:
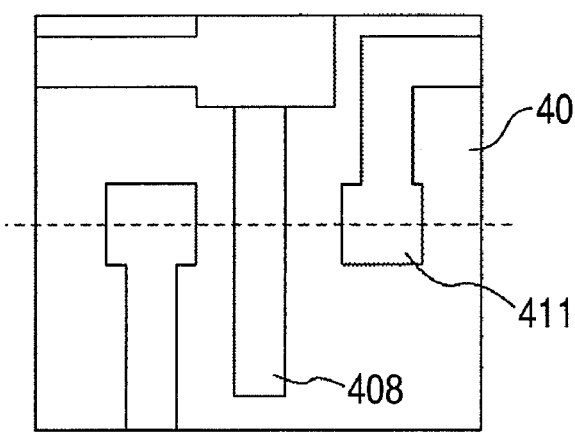
Figure 12:
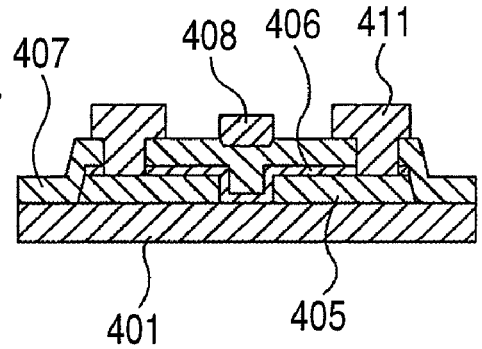
Figure 12:
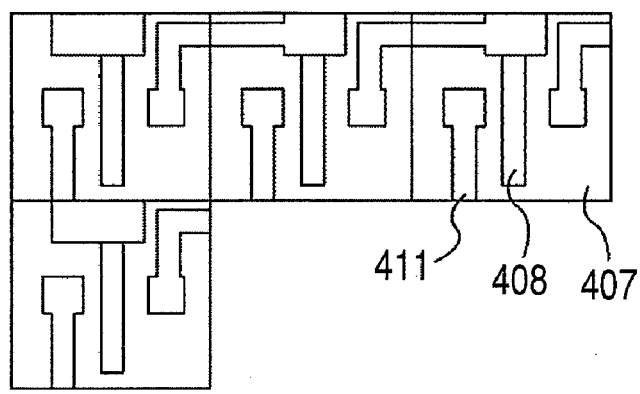

When this transistor is to be used in a field effect transistor array, the field effect transistor array can be constructed by connecting the devices as shown in a top view in FIG. 12(4-9a), for example.

When the transmittances of the substrate 401, the gate electrode 408, the gate insulating film 407, the source and drain electrodes 405, the channel layer 406 and the wiring layer 411 were measured, it was confirmed that they were 80% or more at a visible range.

Fifth Embodiment

The method of manufacturing an oxide semiconductor transistor described in this embodiment is for a bottom gate/top contact structure characterized in that the pattern of a light blocking film 502 formed on the rear side of a substrate 501 is a negative pattern for source and drain electrodes 508.

A fifth embodiment of the method of manufacturing an oxide semiconductor thin film transistor according to the present invention will be described with reference to FIGS. 13(5-1a) to 15(5-9).

Figure 13:
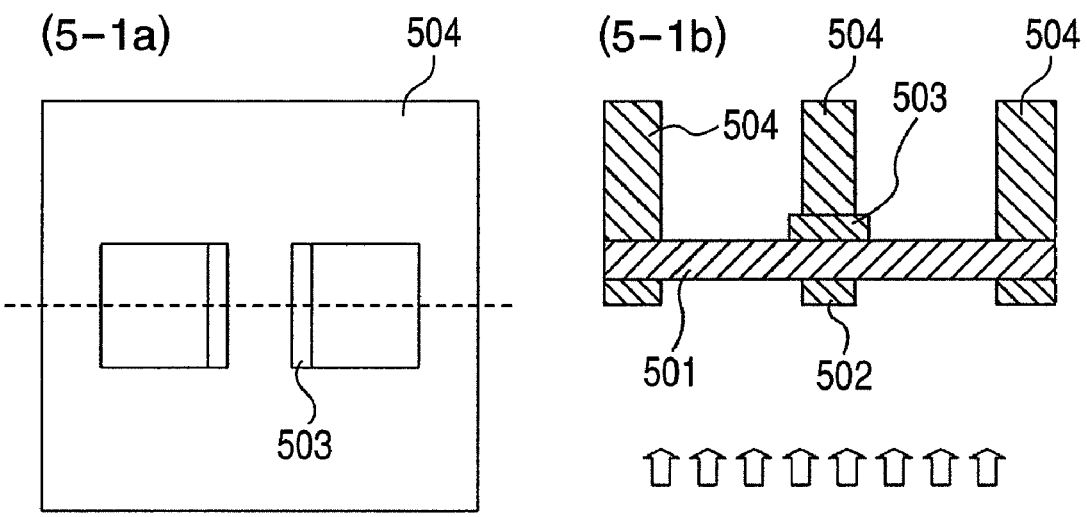
FIGS. 13(5-1a), 13(5-2a) and 13(5-3a) are top views, and FIGS. 13(5-1b), 13(5-2b) and 13(5-3b) are sectional views in the manufacturing method of a fifth embodiment.
Figure 13:
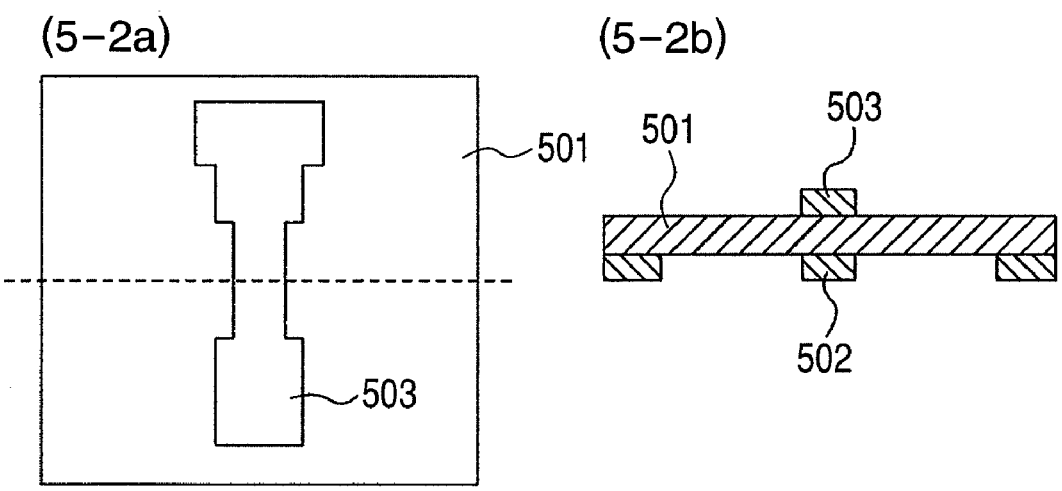
Figure 13:
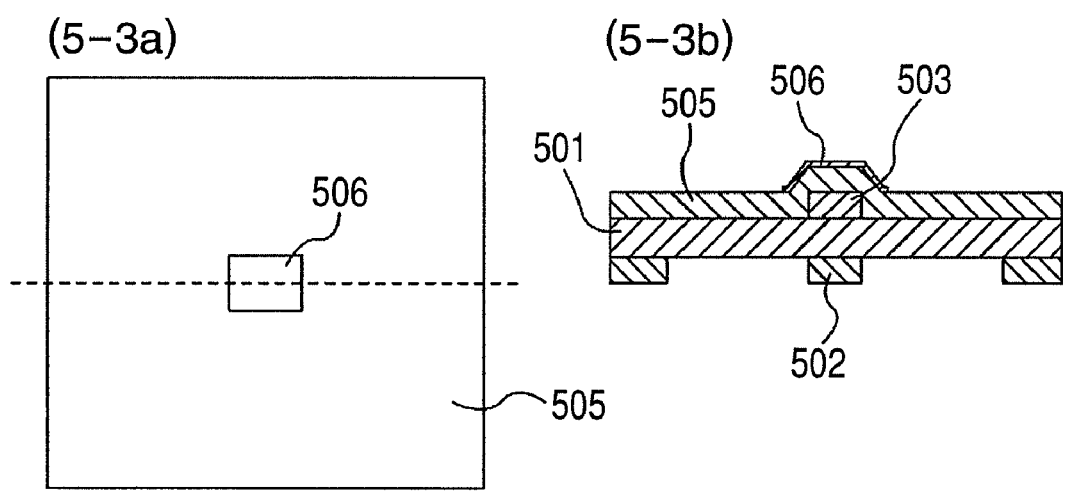

As shown in a top view in FIG. 13(5-1a) and a sectional view in FIG. 13(5-1b), the light blocking film 502 is first formed on the rear side of the substrate 501 in the same manner as in the first embodiment. The light blocking film 502 is shaped into a negative mask pattern for source and drain electrodes by photolithography and etching. Then, a conductive film for a gate electrode 503 having a thickness of 20 to 200 nm is formed on the front side of the substrate 501 by sputtering, plasma enhanced CVD (PECVD) or coating in the same manner as in the first embodiment. In this embodiment, a conductive film for the gate electrode 503 having a thickness of 70 nm is formed from ITO by sputtering at a gas pressure of 0.5 Pa (Ar+2% $O_2$), a DC power of 50 W and a growth temperature (room temperature).

After a resist is applied, the conductive film for the gate electrode 503 is patterned into a desired form by photolithography through the exposure of the front side of the substrate and etching so as to form the gate electrode 503. After a positive resist 504 is applied, a resist 504 pattern is formed by photolithography through the exposure of the rear side of the substrate. Refer to a top view in FIG. 13(5-1a) and a sectional view in FIG. 13(5-1b).

Then, the positive resist 504 is used as a mask to reduce the width of the gate electrode 503 to the same size as the channel length so as to form the gate electrode 503. Thereby, a self-alignment technique which will be used hereinafter can be applied. Then, the positive resist 504 is removed to form the gate electrode 503. Refer to a top view in FIG. 13(5-2a) and a sectional view in FIG. 13(5-2b).

Then, a gate insulating film 505 having a thickness of about 50 to 500 nm covering the gate electrode 503 is formed in the same manner as in the first embodiment. In this embodiment, a gate insulating film 505 having a thickness of 100 nm is formed from silicon oxide ($SiO_x$) by sputtering at a gas pressure of 0.5 Pa (Ar+2% $O_2$), an RF power of 50 W and a growth temperature (200° C.). Then, a channel layer 506 having a thickness of about 5 to 70 nm is formed. The channel layer 506 is formed from $In_xGa_yZn_{1-x-y}O$, ZnO or $Zn_xSn_{1-x}O$ by sputtering or pulsed laser deposition (PLD).

To improve the performance of the oxide semiconductor transistor, the oxide semiconductor may be annealed after its formation. In this embodiment, a channel layer 506 having a thickness of 25 nm is formed from $In_xGa_yZn_{1-x-y}O$ by sputtering at a gas pressure of 0.5 Pa (Ar+2% $O_2$), an RF power of 50 W and a growth temperature (room temperature). Thereafter, a resist is applied to the channel layer 506 which is then patterned into a desired form by photolithography through the exposure of the front side of the substrate and etching. Refer to a top view in FIG. 13(5-3a) and a sectional view in FIG. 13(5-3b).

Figure 14:
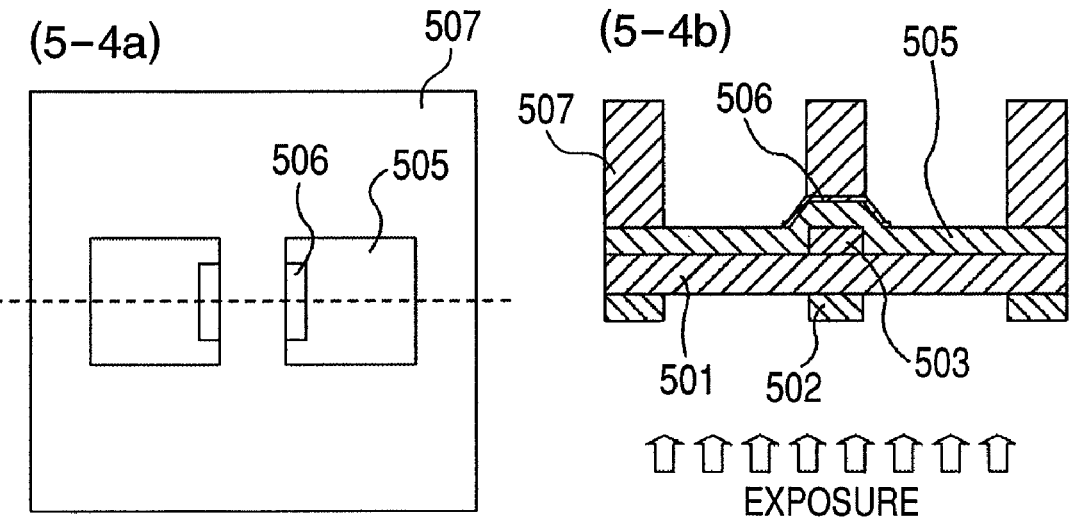
FIGS. 14(5-4a), 14(5-5a) and 14(5-6a) are top views, and FIGS. 14(5-4b), 14(5-5b) and 14(5-6b) are sectional views in the manufacturing method of the fifth embodiment.
Figure 14:
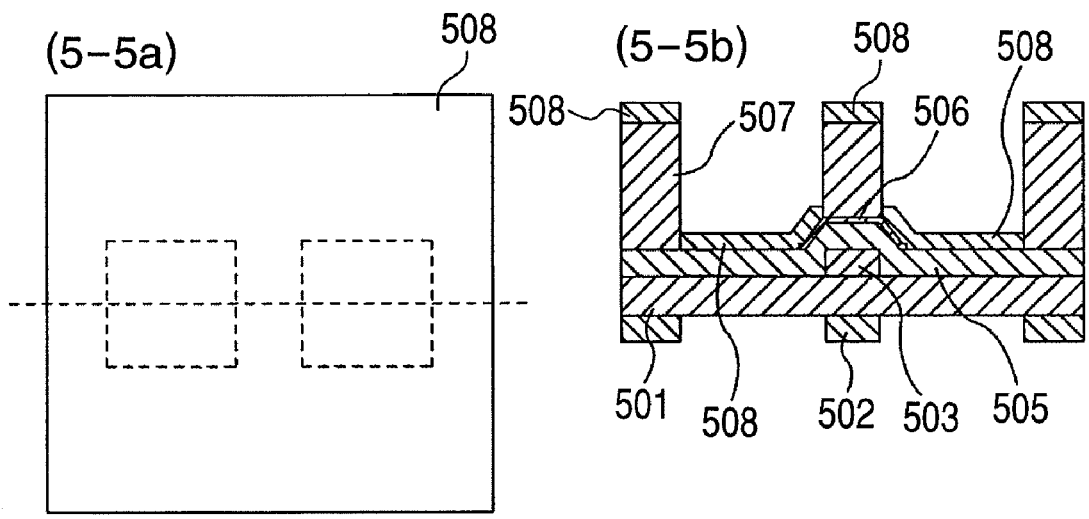
Figure 14:
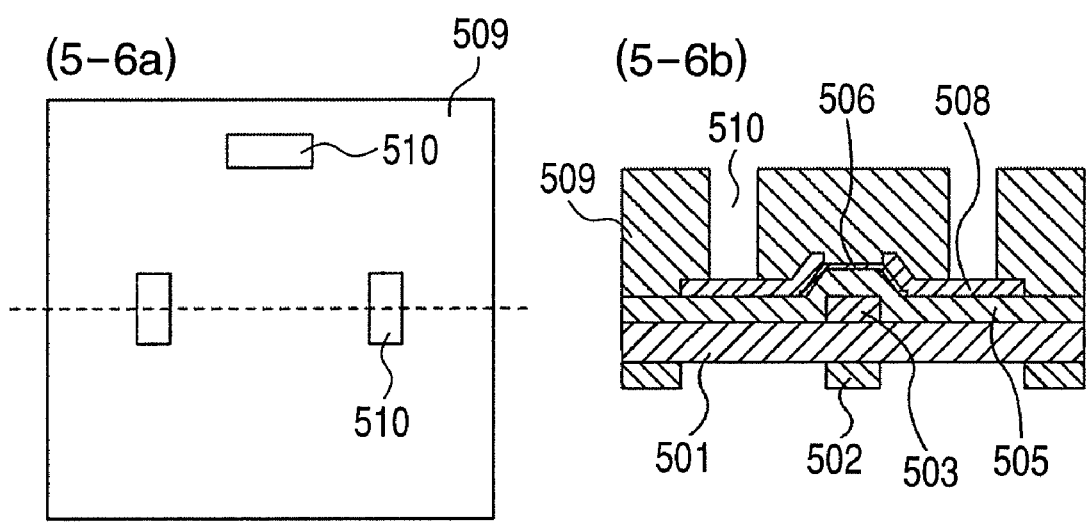

Then, a positive resist 507 is applied to form a lift-off pattern by photolithography through the exposure of the rear side of the substrate 501. Refer to a top view in FIG. 14(5-4a) and a sectional view in FIG. 14(5-4b).

Then, source and drain electrodes 508 having a thickness of about 20 to 200 nm are formed in the same manner as in the first embodiment. In this embodiment, a conductive film for the source and drain electrodes 508 having a thickness of 70 nm is formed from ITO by sputtering at a gas pressure of 0.5 Pa (Ar+2% $O_2$), a DC power of 50 W and a growth temperature (room temperature). Refer to a top view in FIG. 14(5-5a) and a sectional view in FIG. 14(5-5b).

Then, the positive resist 507 and the conductive film for the source and drain electrodes 508 on the resist are removed by the lift-off process. Self-alignment between the lower electrode 503 and the upper electrodes 508 can be carried out by the above process.

A passivation film 509 having a thickness of about 50 to 500 nm is then formed in the same manner as in the first embodiment. In this embodiment, a passivation film 509 having a thickness of 100 nm is formed from silicon oxide ($SiO_x$) by sputtering at a gas pressure of 0.5 Pa (Ar+12% $O_2$), an RF power of 50 W and a growth temperature (200° C.). After a resist is applied, through holes 510 for wirings for electrically interconnecting the wirings 511, the gate electrode 503 and the source and drain electrodes 508 are formed by photolithography through the exposure of the front side of the substrate and etching. Refer to a top view in FIG. 14(5-6a) and a sectional view in FIG. 14(5-6b).

Then, a conductive film for the wirings 511 having a thickness of about 20 to 500 nm is formed in the same manner as in the first embodiment. In this embodiment, a conductive film for the wirings 511 having a thickness of 100 nm is formed from ITO by sputtering at a gas pressure of 0.5 Pa (Ar+2% $O_2$), a DC power of 50 W and a growth temperature (room temperature). Then, a resist mask is formed on the conductive film for the wirings 511 by photolithography and used to pattern the conductive film for the wirings 511 into a desired form so as to form the wirings 511. Refer to a top view in FIG. 15(5-7a) and a sectional view in FIG. 15(5-7b).

The light blocking film 502 formed on the rear side of the substrate 501 is removed in the same manner as in the first embodiment to form a transparent transistor. When the mobility of this transistor was measured, it was 12.3 $cm^2/Vs$. Refer to a top view in FIG. 15(5-8a) and a sectional view in FIG. 15(5-8b) of FIG. 15.

Figure 15:
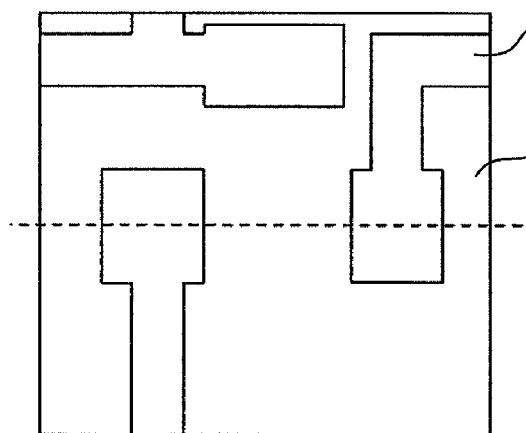
FIGS. 15(5-7a) and 15(5-8a) are top views, FIGS. 15(5-7b) and 15(5-8b) are sectional views, and FIG. 15(5-9) is a wiring diagram in the manufacturing method of the fifth embodiment.
Figure 15:
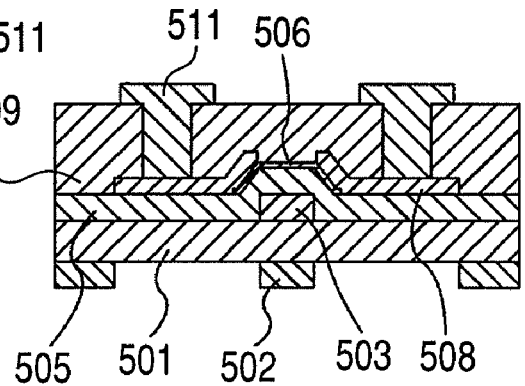
Figure 15:
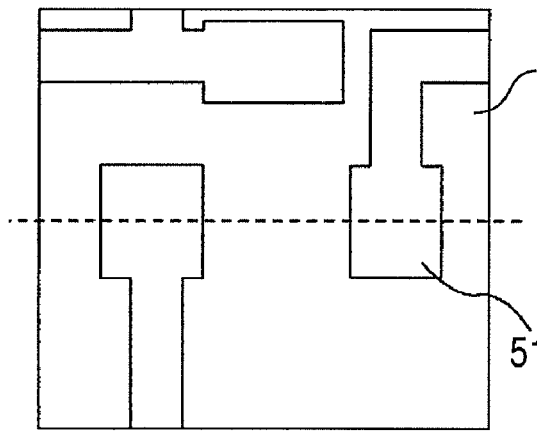
Figure 15:
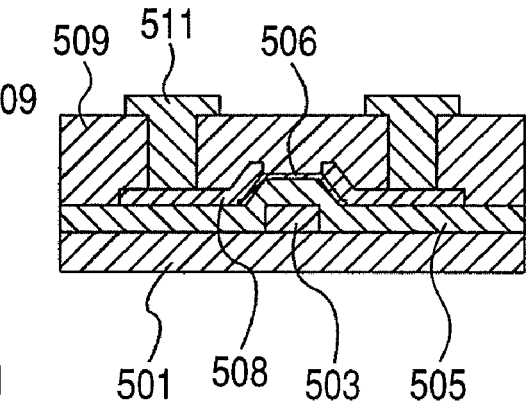
Figure 15:
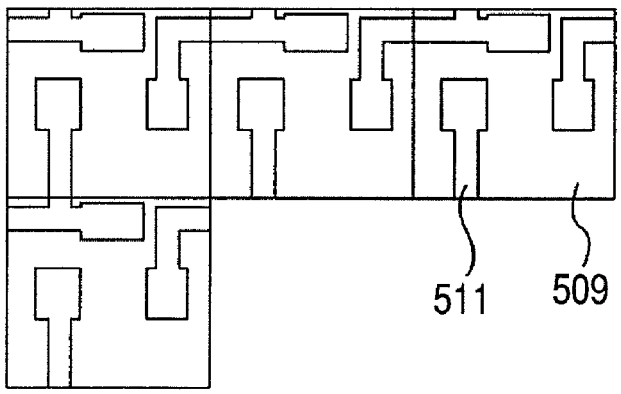

When this transistor is to be used in a field effect transistor array, the field effect transistor array can be constructed by connecting the devices as shown in the wiring diagram in FIG. 15(5-9), for example.

When the transmittances of the substrate 501, the gate electrode 503, the gate insulating film 505, the source and drain electrodes 508, the channel layer 506, the wiring layer 511 and the passivation film 509 were measured, it was confirmed that they were 80% or more at a visible range.

Sixth Embodiment

Figure 16:
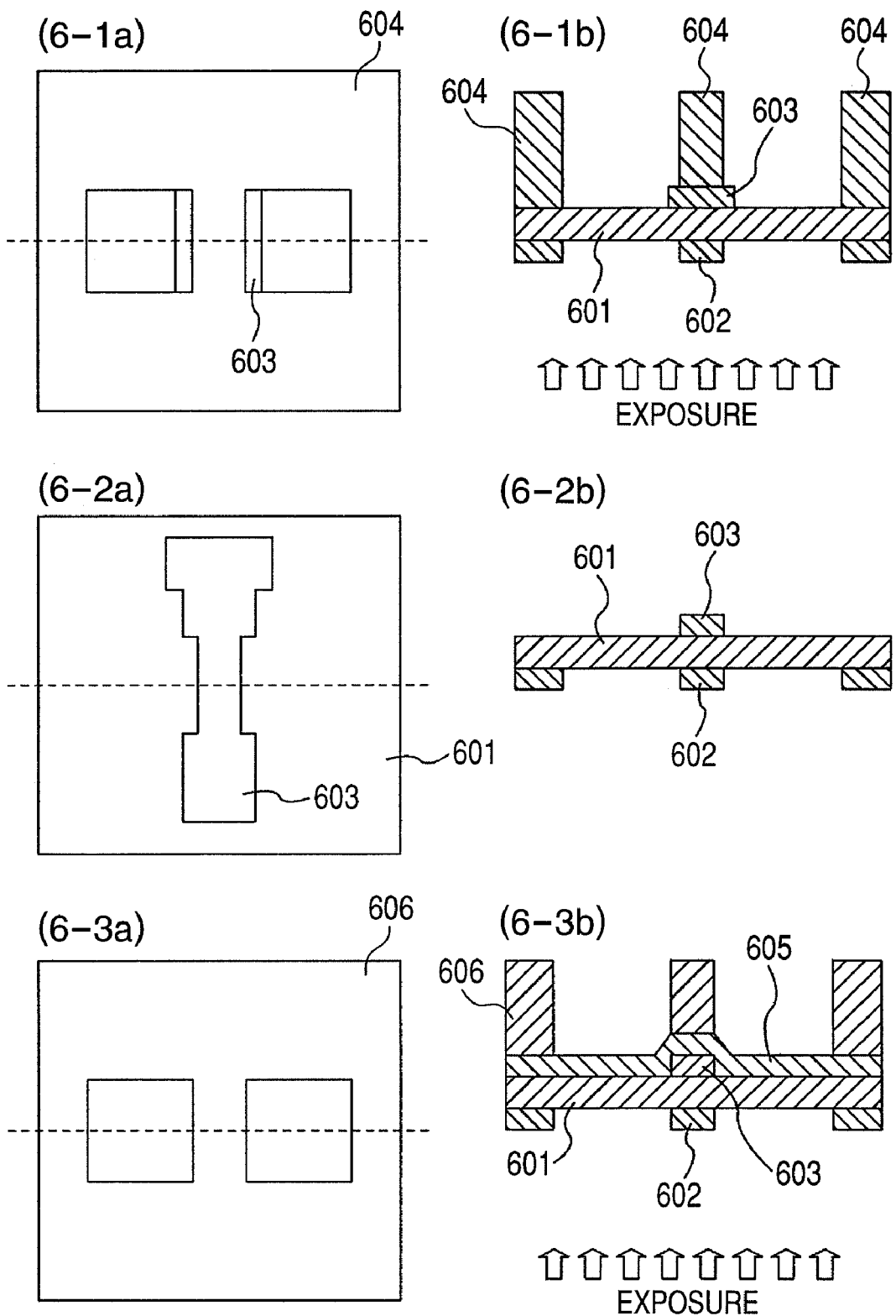
FIGS. 16(6-1a), 16(6-2a) and 16(6-3a) are top views, and FIGS. 16(6-1b), 16(6-2b) and 16(6-3b) are sectional views in the manufacturing method of a sixth embodiment.
Figure 17:
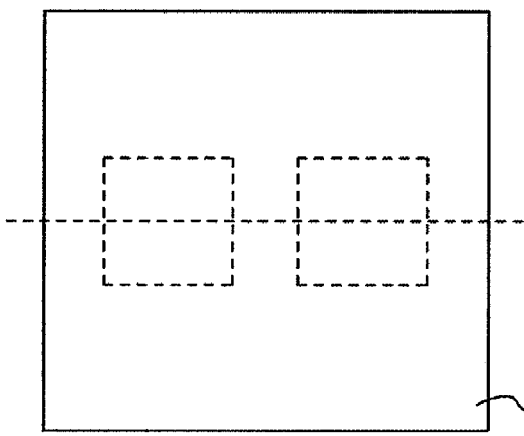
FIGS. 17(6-4a), 17(6-5a) and 17(6-6a) are top views, and FIGS. 17(6-4b), 17(6-5b) and 17(6-6b) are sectional views in the manufacturing method of the sixth embodiment.
Figure 17:
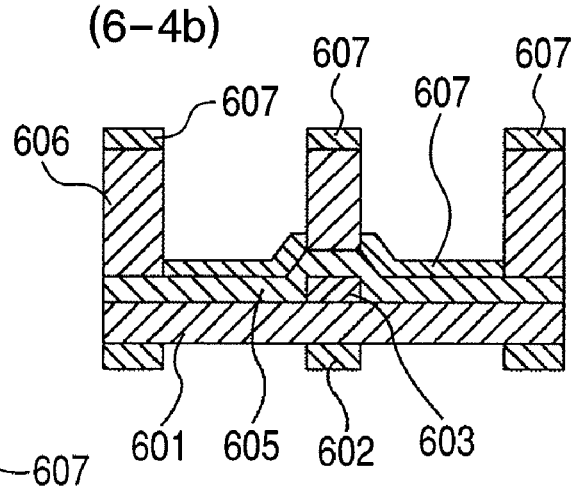
Figure 17:
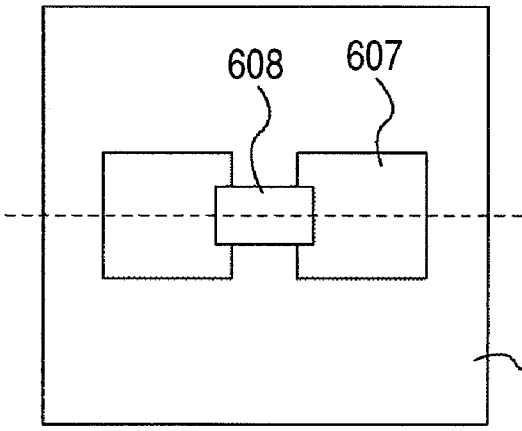
Figure 17:
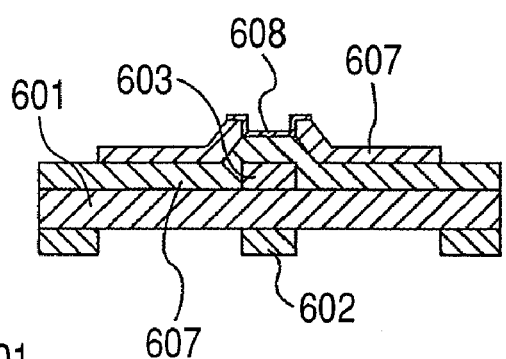
Figure 17:
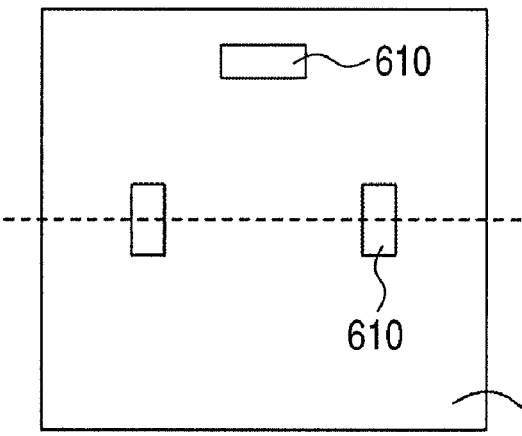
Figure 17:
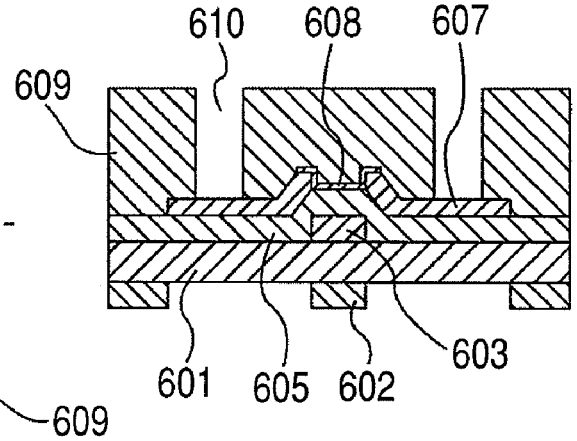

A sixth embodiment of the method of manufacturing an oxide semiconductor thin film transistor according to the present invention will be described with reference to FIGS. 16 to 18. The method of manufacturing an oxide semiconductor thin film transistor of this embodiment is for a bottom gate/bottom contact structure characterized in that the pattern of a light blocking film 602 formed on the rear side of a substrate 601 is a negative pattern for source and drain electrodes 607.

The light blocking film 602 is first formed on the rear side of the substrate 601 in the same manner as in the first embodiment. The light blocking film 602 is shaped into a negative mask pattern for source and drain electrodes by photolithography and etching. Then, a conductive film for a gate electrode 603 having a thickness of 20 to 200 nm is formed on the front side of the substrate 601 by sputtering, plasma enhanced CVD (PECVD) or coating in the same manner as in the first embodiment. In this embodiment, a conductive film for the gate electrode 603 having a thickness of 70 nm is formed from ITO by sputtering at a gas pressure of 0.5 Pa (Ar+2% $O_2$), a DC power of 50 W and a growth temperature (room temperature).

After a resist is applied, the conductive film for the gate electrode 603 is patterned into a desired form by photolithography through the exposure of the front side of the substrate and etching. After a positive resist 604 is applied, a positive resist mask 604 is formed by photolithography through the exposure of the rear side of the substrate. Refer to a top view in FIG. 16(6-1a) and a sectional view in FIG. 16(6-1b).

Then, the width of the gate electrode 603 was reduced to the same size as the channel length by using the positive resist mask 604. Thereby, the self-aligning technique which will be used hereinafter can be applied. Then, the positive resist 604 is removed to form the gate electrode 603. Refer to a top view in FIG. 16(6-2a) and a sectional view in FIG. 16(6-2b).

A gate insulating film 605 covering the gate electrode 603 and having a thickness of about 50 to 500 nm is then formed in the same manner as in the first embodiment. In this embodiment, a gate insulating film 605 having a thickness of 100 nm is formed from silicon oxide ($SiO_x$) by sputtering at a gas pressure of 0.5 Pa (Ar+2% $O_2$), an RF power of 50 W and a growth temperature (200° C.). Then, a positive resist 606 is applied to form a lift-off pattern by photolithography through the exposure of the rear side of the substrate 601. Refer to a top view in FIG. 16(6-3a) and a sectional view in FIG. 16(6-3b) of FIG. 16.

Then, a conductive film for the source and drain electrodes 607 having a thickness of about 20 to 200 nm is formed in the same manner as in the first embodiment. In this embodiment, a conductive film for the source and drain electrodes 607 having a thickness of 70 nm is formed from ITO by sputtering at a gas pressure of 0.5 Pa (Ar+20 $O_2$), a DC power of 50 W and a growth temperature (room temperature). Refer to a top view in FIG. 17(6-4a) and a sectional view in FIG. 17(6-4b).

Then, the positive resist 606 and the conductive film for the source and drain electrodes 607 on the resist are removed by the lift-off process. Self-alignment between the lower electrode 603 and the upper electrodes 607 can be carried out by the above process.

A channel layer 608 having a thickness of about 5 to 70 nm is then formed. The channel layer 608 is formed from $In_xGa_yZn_{1-x-y}O$, ZnO or $Zn_xSn_{1-x}O$ by sputtering or pulsed laser deposition (PLD). A resist film is formed on the channel layer 608 by coating, and the channel layer 608 is patterned into a desired form by photolithography through the exposure of the front side of the substrate and etching. Refer to a top view in FIG. 17(6-5a) and a sectional view in FIG. 17(6-5b).

Then, a passivation film 609 having a thickness of about 50 to 500 nm is formed in the same manner as in the first embodiment. In this embodiment, a passivation film 609 having a thickness of 100 nm is formed from silicon oxide ($SiO_x$) by sputtering at a gas pressure of 0.5 Pa (Ar+12% $O_2$), an RF power of 50 W and a growth temperature (room temperature).

After a resist is applied, through holes 610 for wirings for electrically interconnecting the wirings 611, the gate electrode 603 and the source and drain electrodes 607 are formed by photolithography through the exposure of the front side of the substrate and etching. Refer to a top view in FIG. 17(6-6a) and a sectional view in FIG. 17(6-6b).

Then, a conductive film for the wirings 611 having a thickness of about 20 to 500 nm is formed in the same manner as in the first embodiment. In this embodiment, a conductive film for the wirings 611 having a thickness of 100 nm is formed from ITO by sputtering at a gas pressure of 0.5 Pa (Ar+2% $O_2$), a DC power of 50 W and a growth temperature (room temperature).

Then, a resist mask is formed on the conductive film for the wirings 611 by photolithography and used to pattern the conductive film for the wirings 611 into a desired from so as to form the wirings 611. Refer to a top view in FIG. 18(6-7a) and a sectional view (6-7b).

Then, the light blocking film 602 formed on the rear side of the substrate 601 is removed in the same manner as in the first embodiment to form a transparent transistor. When the mobility of this transistor was measured, it was 11.1 cm²/Vs. Refer to a top view in FIG. 18(6-8a) and a sectional view in FIG. 18(6-8b).

Figure 18:
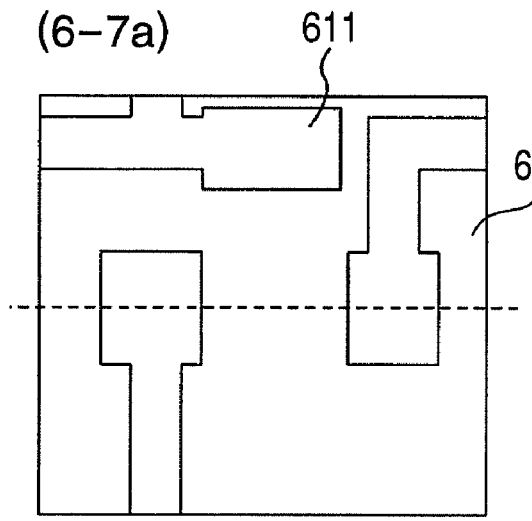
FIGS. 18(6-7a) and 18(6-8a) are top views, FIGS. 18(6-7b) and 18(6-8b) are sectional views, and FIG. 18(6-9) is a wiring diagram in the manufacturing method of the sixth embodiment.
Figure 18:
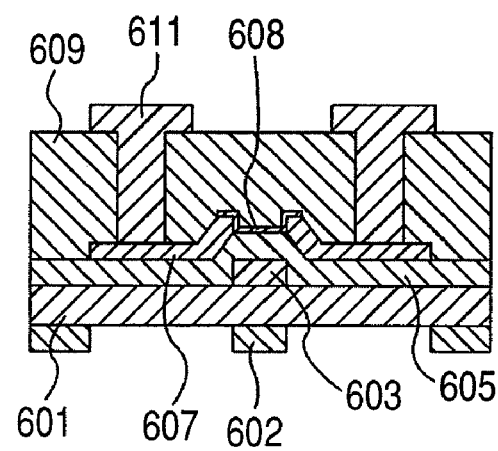
Figure 18:
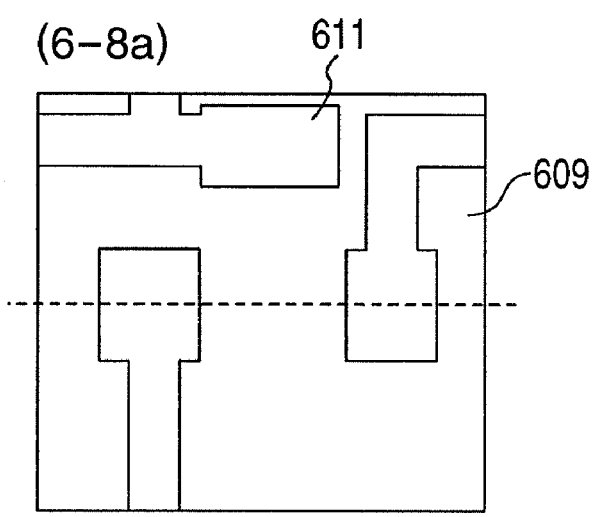
Figure 18:
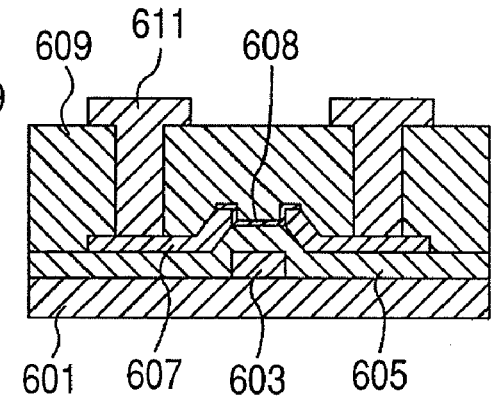
Figure 18:
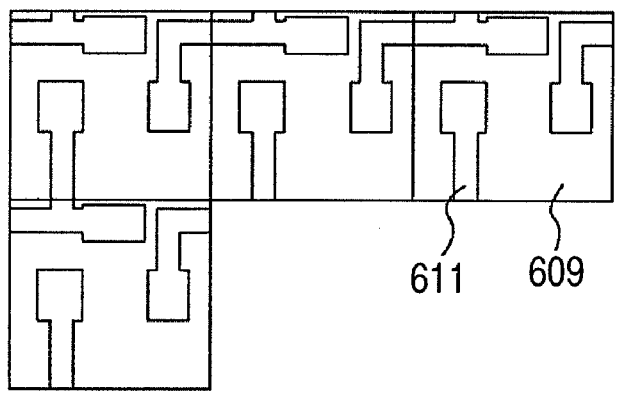

When this field effect transistor is to be used in a field effect transistor array, the field effect transistor array can be constructed by connecting the devices as shown in the wiring diagram in FIG. 18(6-9), for example.

When the transmittances of the substrate 601, the gate electrode 603, the gate insulating film 605, the source and drain electrodes 607, the channel layer 608, the wiring layer 611 and the passivation film 609 were measured, it was confirmed that they were 80% or more at a visible range.

Seventh Embodiment

A seventh embodiment of the method of manufacturing an oxide semiconductor thin film transistor will be described hereinbelow. The manufacturing method of this embodiment is for a top gate/top contact structure characterized in that the pattern of a light blocking film 702 on the rear side of a substrate 701 is a negative pattern for source and drain electrodes 705.

The light blocking film 702 is first formed on the rear side of the substrate 701 in the same manner as in the first embodiment. The light blocking film 702 is shaped into a negative mask pattern for source and drain electrodes by photolithography and etching. Then, a channel layer 703 having a thickness of about 5 to 70 nm is formed in the same manner as in the first embodiment. The channel layer 703 is formed from $In_xGa_yZn_{1-x-y}O$, ZnO or $Zn_xSn_{1-x}O$ by sputtering or pulsed laser deposition (PLD).

Figure 19:
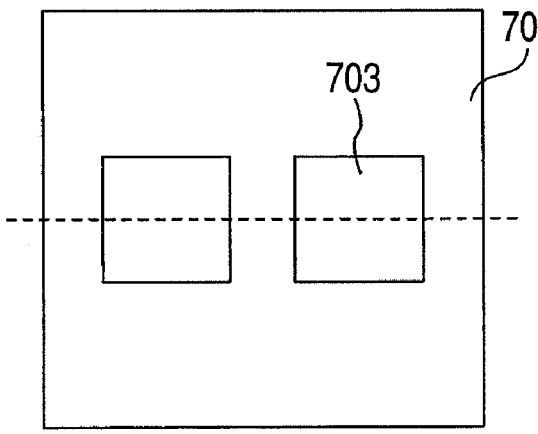
FIGS. 19(7-1a), 19(7-2a) and 19(7-3a) are top views, and FIGS. 19(7-1b), 19(7-2b) and 19(7-3b) are sectional views in the manufacturing method of a seventh embodiment.
Figure 19:
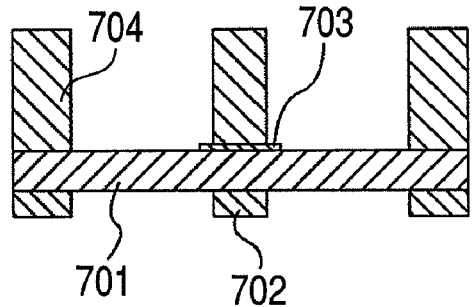
Figure 19:
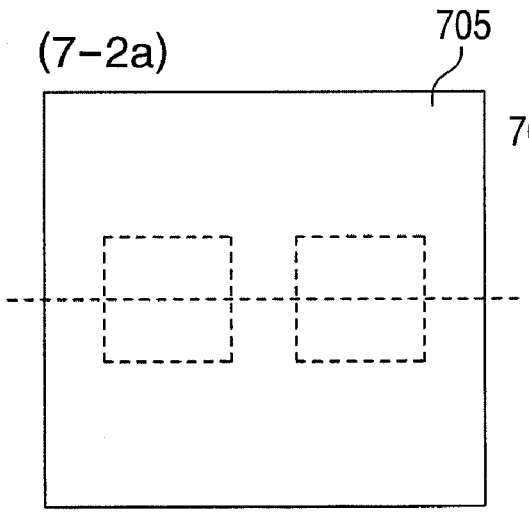
Figure 19:
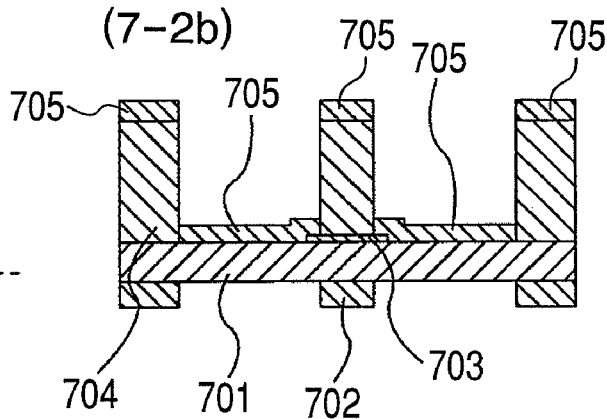
Figure 19:
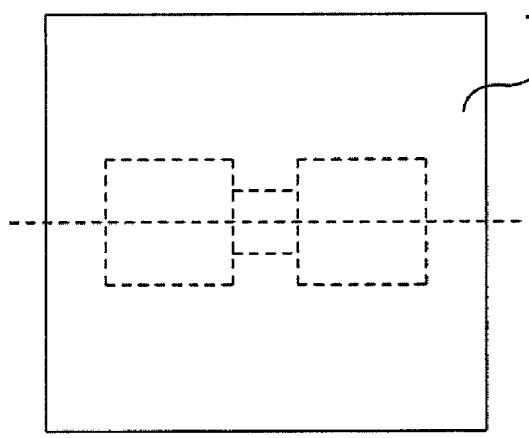
Figure 19:
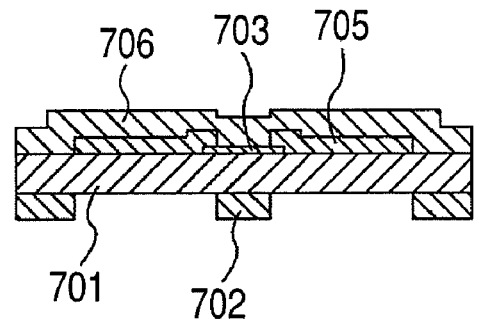

To improve the performance of the oxide semiconductor transistor, the oxide semiconductor may be annealed after its formation. In this embodiment, a channel layer 703 having a thickness of 25 nm is formed from $In_xGa_yZn_{1-x-y}O$ by sputtering at a gas pressure of 0.5 Pa (Ar+2% $O_2$), an RF power of 50 W and a growth temperature (room temperature). Thereafter, a resist is applied to the channel layer 703 which is then patterned into a desired form by photolithography through the exposure of the front side of the substrate and etching. Then, a positive resist 704 is applied to form a lift-off pattern by photolithography through the exposure of the rear side of the substrate. Refer to a top view in FIG. 19(7-1a) and a sectional view in FIG. 19(7-1b).

Then, a conductive film for the source and drain electrodes 705 having a thickness of about 20 to 200 nm is formed in the same manner as in the first embodiment. In this embodiment, a conductive film for the source and drain electrodes 705 having a thickness of 70 nm is formed from ITO by sputtering at a gas pressure of 0.5 Pa (Ar+2% $O_2$), a DC power of 50 W and a growth temperature (room temperature). Refer to a top view in FIG. 19(7-2a) and a sectional view in FIG. 19(7-2b).

Then, the positive resist 704 and the conductive film for the source and drain electrodes 705 on the resist are removed by the lift-off process. Thereafter, a gate insulating film 706 for electrically isolating the lower electrodes 705 and an upper electrode 707 is formed to a thickness of about 50 to 500 nm in the same manner as in the first embodiment. In this embodiment, a gate insulating film 706 having a thickness of 100 nm is formed from silicon oxide ($SiO_x$) by sputtering at a gas pressure of 0.5 Pa (Ar+10% $O_2$), an RF power of 50 W and a growth temperature (200° C.). Refer to a top view in FIG. 19(7-3a) and a sectional view in FIG. 19(7-3b).

Figure 20:
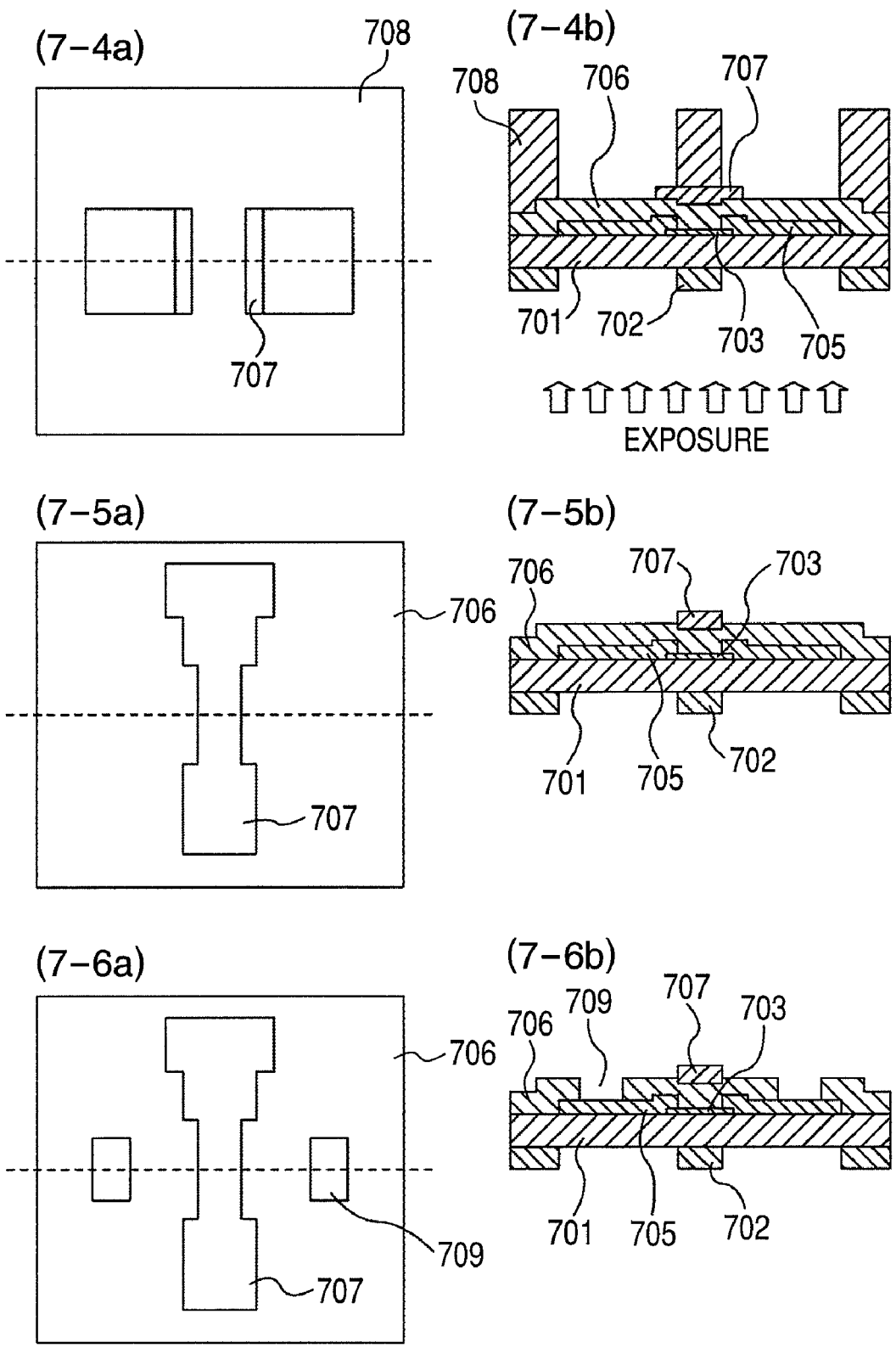
FIGS. 20(7-4a), 20(7-5a) and 20(7-6a) are top views, and FIGS. 20(7-4b), 20(7-5b) and 20(7-6b) are sectional views in the manufacturing method of the seventh embodiment.

Then, a conductive film for the gate electrode 707 having a thickness of 20 to 200 nm is formed by sputtering, plasma enhanced CVD (PECVD) or coating. In this embodiment, a conductive film for the gate electrode 707 having a thickness of 70 nm is formed from ITO by sputtering at a gas pressure of 0.5 Pa (Ar+2% $O_2$), a DC power of 50 W and a growth temperature (room temperature). Then, a resist is applied to form the gate electrode 707 by photolithography through the exposure of the front side of the substrate. After a positive resist 708 is applied, a positive resist 708 pattern is formed by photolithography through the exposure of the rear side of the substrate. Refer to a top view in FIG. 20(7-4a) and a sectional view in FIG. 20(7-4b).

Then, the width of the gate electrode 707 is reduced to the same size as the channel length by using the positive resist 708 pattern as a mask. Self-alignment between the lower electrodes 705 and the upper electrode 707 can be carried out by the above process. Then, the positive resist 708 is removed to form the gate electrode 707. Refer to a top view (7-5a) and a sectional view in FIG. 20(7-5b).

After a resist is applied, through holes 709 for wirings for electrically interconnecting the wirings 710 and the source and drain electrodes 705 are formed by photolithography through the exposure of the front side of the substrate and etching. Refer to a top view (7-6a) and a sectional view in FIG. 20(7-6b).

Then, a conductive film for the wirings 710 having a thickness of about 20 to 500 nm is formed in the same manner as in the first embodiment. In this embodiment, a conductive film for the wirings 710 having a thickness of 100 nm is formed from ITO by sputtering at a gas pressure of 0.5 Pa (Ar+2% $O_2$), a DC power of 50 W and a growth temperature (room temperature). Then, a resist film mask is formed on the conductive film for the wirings 710 by photolithography and used to pattern the conductive film for the wirings 710 into a desired form so as to form the wirings 710. Refer to a top view in FIG. 21(7-7a) and a sectional view in FIG. 21(7-7b).

Thereafter, the light blocking film 702 formed on the rear side of the substrate 701 is removed in the same manner in the first embodiment to form a transparent transistor. When the mobility of this transistor was measured, it was 10.5 $cm^2$/Vs. Refer to a top view in FIG. 21(7-8a) and a sectional view in FIG. 21(7-8b).

Figure 21:
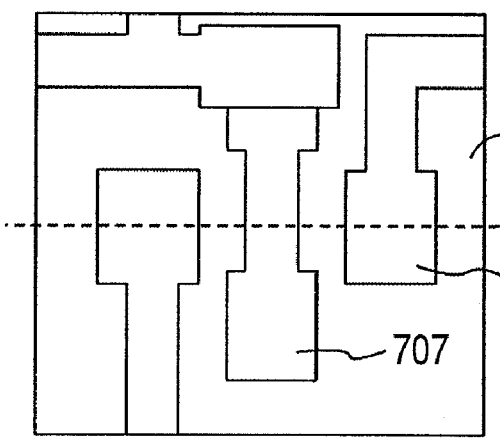
FIGS. 21(7-7a) and 21(7-8a) are top views, FIGS. 21(7-7b) and 21(7-8b) are sectional views, and FIG. 21(7-9) is a wiring diagram in the manufacturing method of the seventh embodiment.
Figure 21:
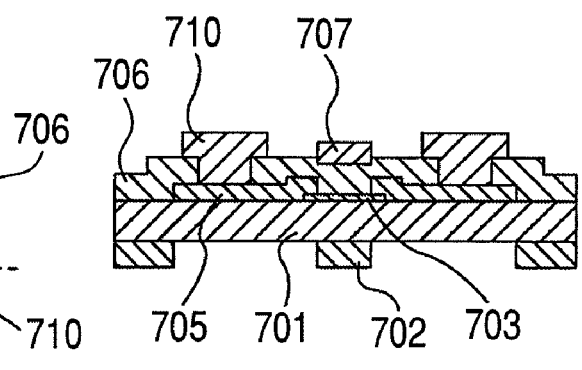
Figure 21:
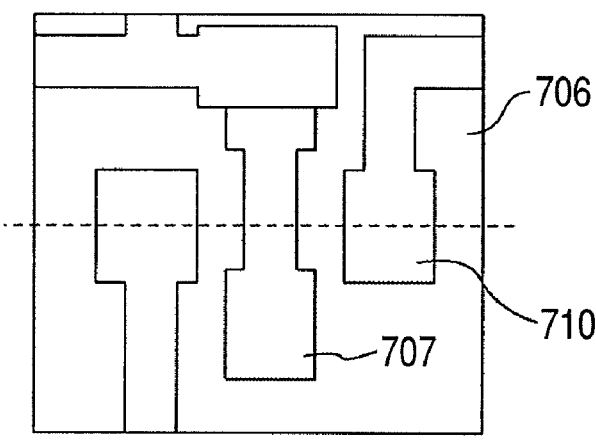
Figure 21:
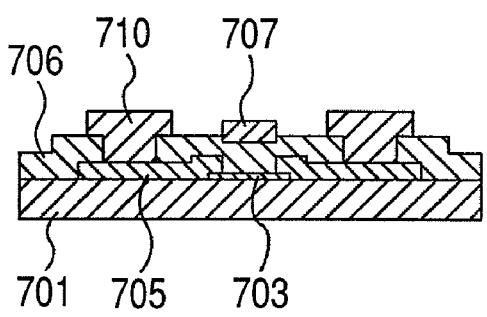
Figure 21:
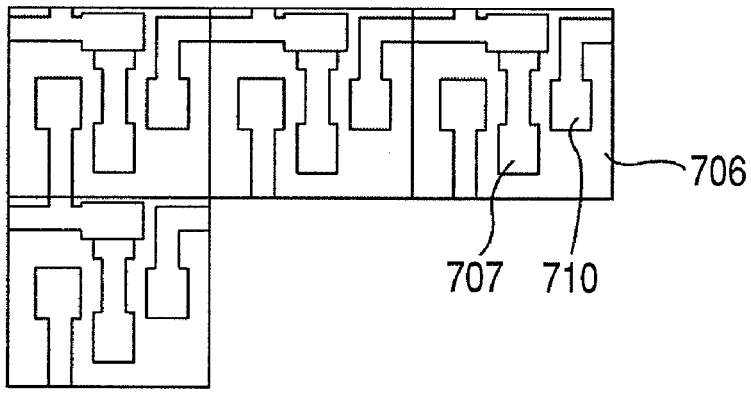

When this transistor is to be used in a field effect transistor array, the field effect transistor array can be constructed by connecting the devices as shown in the wiring diagram in FIG. 21(7-9), for example.

When the transmittances of the substrate 701, the gate electrode 707, the gate insulating film 706, the source and drain electrodes 705, the channel layer 703 and the wiring layer 710 were measured, it was confirmed that they were 80% or more at a visible range.

Eighth Embodiment

An eighth embodiment of the method of manufacturing an oxide semiconductor thin film transistor will be described hereinbelow. The manufacturing method of this embodiment is for a top gate/bottom contact structure characterized in that the pattern of a light blocking film 802 on the rear side of a substrate 801 is a negative pattern for source and drain electrodes 804.

Figure 22:
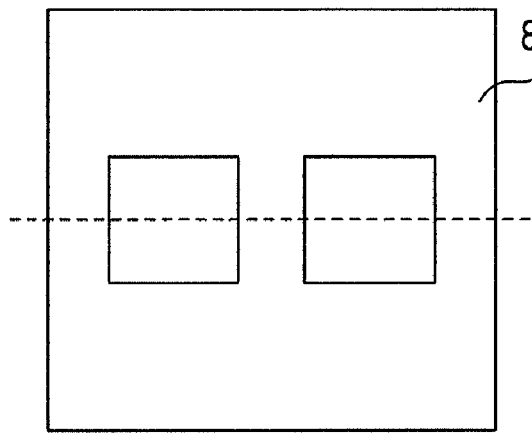
FIGS. 22(8-1a), 22(8-2a) and 22(8-3a) are top views, and FIGS. 22(8-1b), 22(8-2b) and 22(8-3b) are sectional views in the manufacturing method of an eighth embodiment.
Figure 22:
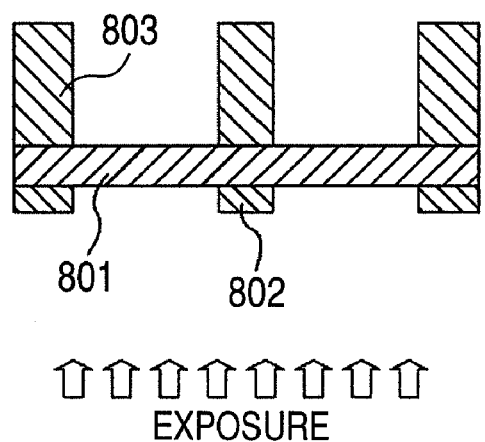
Figure 22:
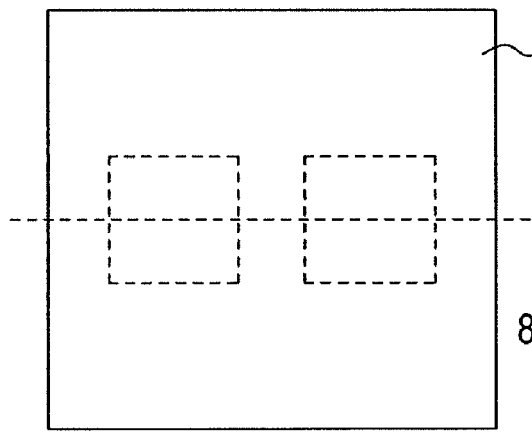
Figure 22:
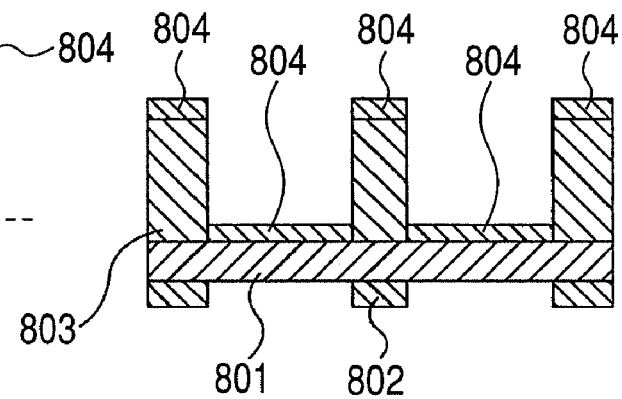
Figure 22:
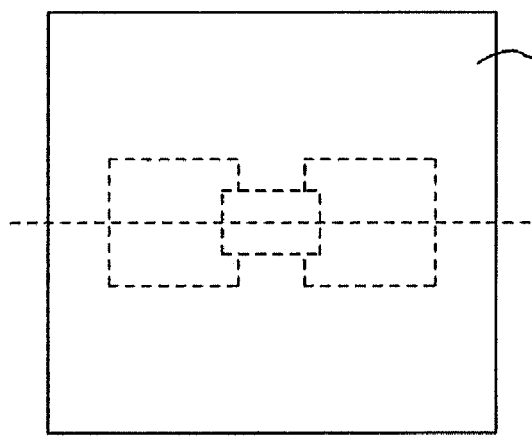
Figure 22:
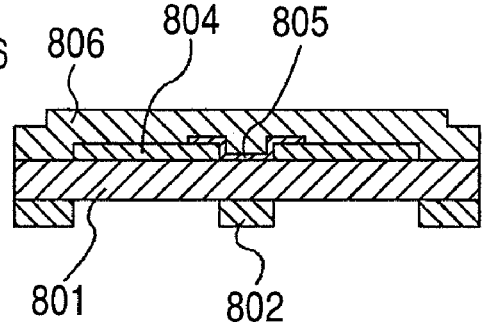

The light blocking film 802 is first formed on the rear side of the substrate 801 in the same manner as in the first embodiment. The light blocking film 802 is shaped into a negative mask pattern for source and drain electrodes by photolithography and etching. Then, a positive resist 803 is applied to form a lift-off pattern by photolithography through the exposure of the rear side of the substrate. Refer to a top view in FIG. 22(8-1a) and a sectional view in FIG. 22(8-1b).

Then, a conductive film for the source and drain electrodes 804 having a thickness of about 20 to 200 nm is formed in the same manner as in the first embodiment. In this embodiment, a conductive film for the source and drain electrodes 804 having a thickness of 70 nm is formed from ITO by sputtering at a gas pressure of 0.5 Pa (Ar+2% $O_2$), a DC power of 50 W and a growth temperature (room temperature). Refer to a top view in FIG. 22(8-2a) and a sectional view in FIG. 22(8-2b).

Then, the positive resist 803 and the conductive film for the source and drain electrodes 804 on the resist are removed by the lift-off process. Thereafter, a channel layer 805 having a thickness of about 5 to 70 nm is formed in the same manner as in the first embodiment. The channel layer 805 is formed from $In_xGa_yZn_{1-x-y}O$, ZnO or $Zn_xSn_{1-x}O$ by sputtering or pulsed laser deposition (PLD). To improve the performance of the oxide semiconductor transistor, the oxide semiconductor may be annealed after its formation. In this embodiment, a channel layer 805 having a thickness of 25 nm is formed from $In_xGa_yZn_{1-x-y}O$ by sputtering at a gas pressure of 0.5 Pa (Ar+2% $O_2$), an RF power of 50 W and a growth temperature (room temperature).

Thereafter, a resist is applied to the channel layer 805 which is then patterned into a desired form by photolithography through the exposure of the front side of the substrate and etching. Then, a gate insulating film 806 for electrically isolating the lower electrodes 804 and an upper electrode 807 is formed to a thickness of about 50 to 500 nm in the same manner as in the first embodiment. In this embodiment, a gate insulating layer 806 having a thickness of 100 nm is formed from silicon oxide ($SiO_x$) by sputtering at a gas pressure of 0.5 Pa (Ar+10% $O_2$), an RF power of 50 W and a growth temperature (200° C.). Refer to a top view in FIG. 22(8-3a) and a sectional view in FIG. 22(8-3b).

Figure 23:
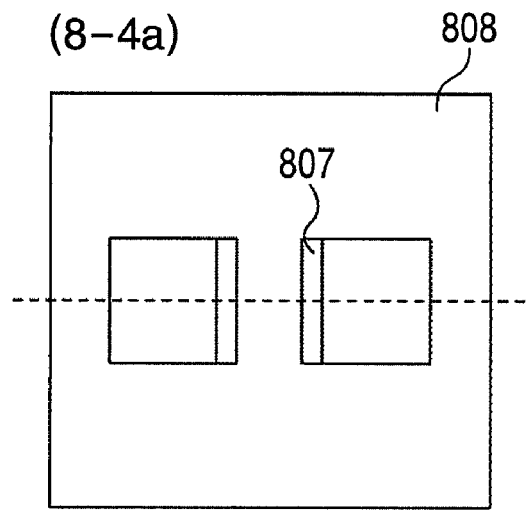
FIGS. 23(8-4a), 23(8-5a) and 23(8-6a) are top view, and FIGS. 23(8-4b), 23(8-5b) and 23(8-6b) are sectional views in the manufacturing method of the eighth embodiment.
Figure 23:
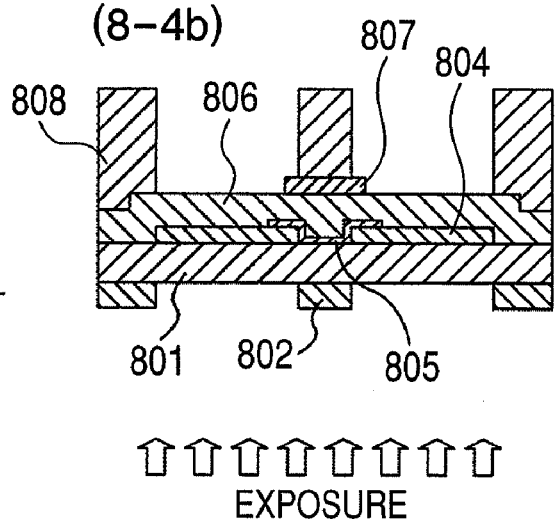
Figure 23:
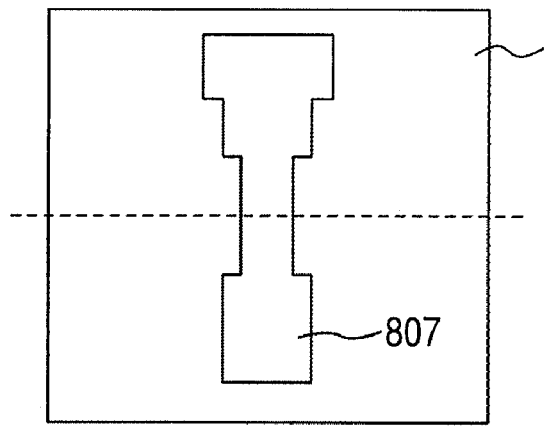
Figure 23:
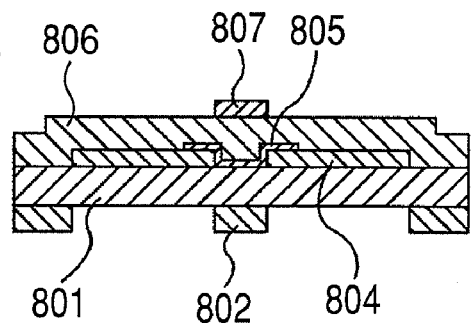
Figure 23:
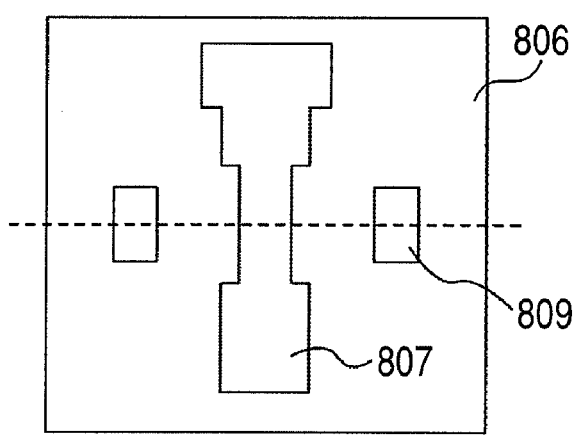
Figure 23:
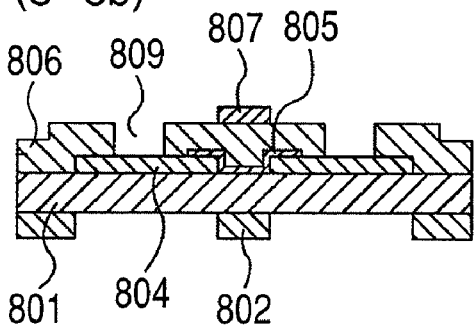

Then, a conductive film for the gate electrode 807 having a thickness of 20 to 200 nm is formed by sputtering, plasma enhanced CVD (PECVD), pulsed laser deposition (PLD) or coating. In this embodiment, a conductive film for the gate electrode 807 having a thickness of 100 nm is formed from ITO by sputtering at a gas pressure of 0.5 Pa (Ar+2% $O_2$), a DC power of 50 W and a growth temperature (room temperature). After a resist is applied, the gate electrode 807 is patterned by photolithography through the exposure of the front side of the substrate and etching. Then, a positive resist 808 is applied to form a positive resist 808 pattern by photolithography through the exposure of the rear side of the substrate. Refer to a top view in FIG. 23(8-4a) and a sectional view in FIG. 23(8-4b).

Then, the width of the gate electrode 807 is reduced to the same size as the channel length by using the resist 808 as a mask. Self-alignment between the lower electrodes 804 and the upper electrode 807 can be carried out by the above process. Then, the positive resist 808 is removed to form the gate electrode 807. Refer to a top view in FIG. 23(8-5a) and a sectional view in FIG. 23(8-5b).

After a resist is applied, through holes 809 for wirings for electrically interconnecting the wirings 810 and the source and drain electrodes 804 are formed by photolithography through the exposure of the front side of the substrate and etching. Refer to a top view (8-6a) and a sectional view (8-6b) of FIG. 23.

Then, a conductive film for the wirings 810 is formed to a thickness of about 20 to 500 nm in the same manner as in the first embodiment. In this embodiment, a conductive film for the wirings 810 having a thickness of 100 nm is formed from ITO by sputtering at a gas pressure of 0.5 Pa (Ar+2% $O_2$), a DC power of 50 W and a growth temperature (room temperature). Then, a resist mask is formed on the conductive film for the wirings 810 by photolithography and used to pattern the conductive film for the wirings 810 into a desired form so as to form the wirings 810. Refer to a top view (8-7a) and a sectional view (8-7b) of FIG. 24.

Thereafter, the light blocking film 802 formed on the rear side of the substrate 801 is removed in the same manner in the first embodiment to form a transparent transistor. When the mobility of this transistor was measured, it was 11.0 cm$^2$/Vs. Refer to a top view in FIG. 24(8-8*a*) and a sectional view in FIG. 24(8-8*b*).

Figure 24:
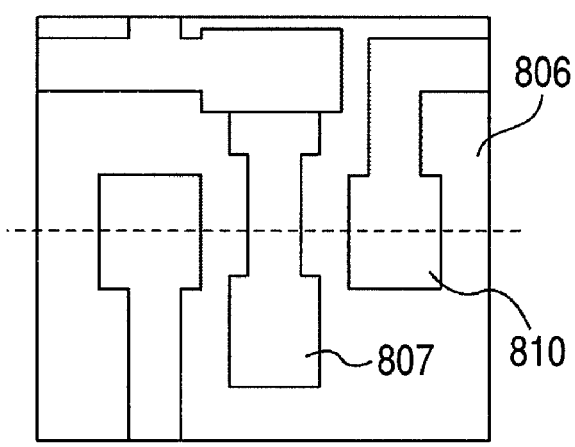
FIG. 24(8-7a) and 24(8-8a) are top views, FIGS. 24(8-7b) and 24(8-8b) are sectional views, and FIG. 24(8-9) is a wiring diagram in the manufacturing method of the eighth embodiment.
Figure 24:
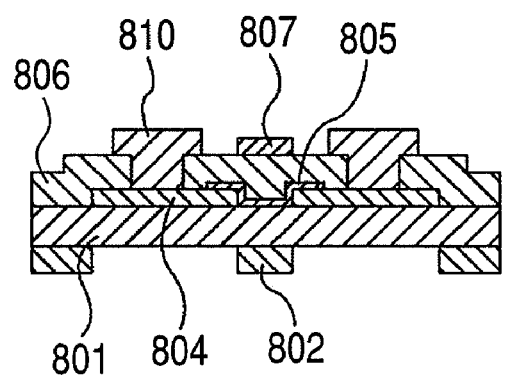
Figure 24:
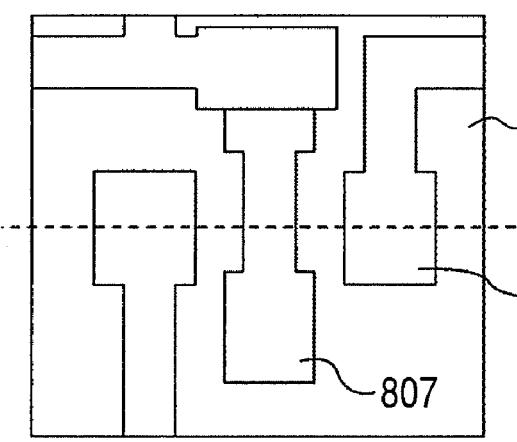
Figure 24:
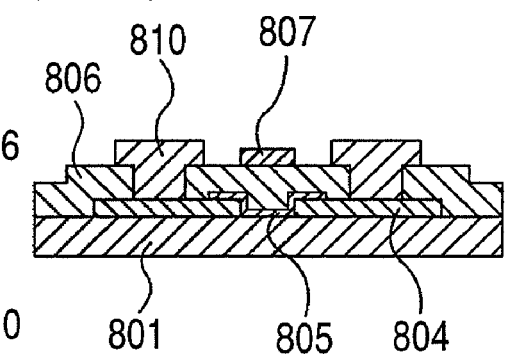
Figure 24:
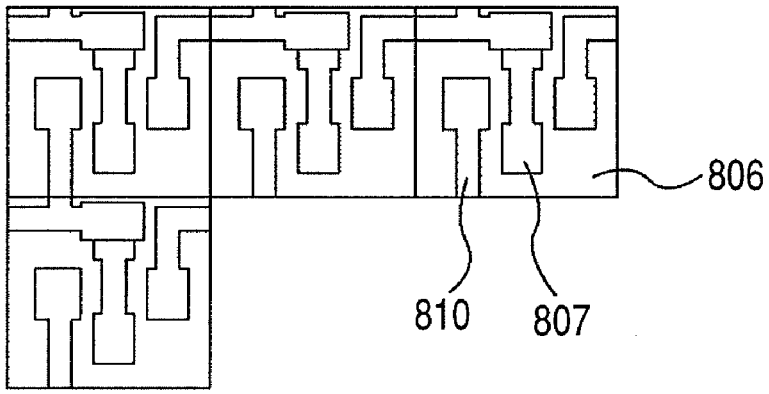

When this transistor is to be used in the field effect transistor array of an active matrix type liquid crystal display, the field effect transistor array can be constructed by connecting the devices as shown in the wiring diagram in FIG. 24(8-9), for example.

When the transmittances of the substrate 801, the gate electrode 807, the gate insulating film 806, the source and drain electrodes 804, the channel layer 805 and the wiring layer 810 were measured, it was confirmed that they were 80% or more at a visible range.

The present invention can be applied to a method of manufacturing a field effect transistor having an oxide semiconductor.

What is claimed is:

1. A method of manufacturing a field effect transistor having an oxide semiconductor, comprising:
   forming a mask pattern for a lower electrode from a light blocking film on the rear side of a substrate made of a translucent material;
   carrying out photolithography through the exposure of the rear side of the substrate at least twice using the light blocking film as a mask; and
   carrying out self-alignment between the lower electrode and an upper electrode both made of a transparent material.

2. The method of manufacturing a field effect transistor according to claim 1, wherein the lower electrode made of a translucent material is used as a gate electrode and source and drain electrodes are formed after the formation of the gate electrode so as to form a bottom gate structure.

3. The method of manufacturing a field effect transistor according to claim 1, wherein the lower electrode made of a translucent material is used as a source and a drain, and a gate electrode is formed after the formation of the source and drain electrodes to form a top gate structure.

4. The method of manufacturing a field effect transistor according to claim 1, comprising:
   forming a channel layer and a source and drain electrode layer,
   wherein the step of forming the source and drain electrode layer includes:
   applying a negative resist to form a lift-off pattern by photolithography through the exposure of the front side of the substrate;
   forming a plurality of the channel layers;
   applying a positive resist to form a lift-off pattern by photolithography through the exposure of the rear side of the substrate using the light blocking film as a mask;
   forming a plurality of the source and drain electrodes; and
   removing the photoresists and lifting off the channel layer and the source and drain electrode layer on the photoresists to form a pattern.

5. The method of manufacturing a field effect transistor according to claim 1, comprising:
   forming a channel layer and a source and drain electrode layer,
   wherein this step includes:
   applying a negative resist to form a lift-off pattern by photolithography through the exposure of the front side of the substrate;
   applying a positive resist to form a lift-off pattern by photolithography through the exposure of the rear side of the substrate using the light blocking film as a mask;
   forming a plurality of the source and drain electrodes;
   lifting off the source and drain electrode layer on the photoresists by removing the photoresists to form a pattern;
   applying a negative resist to form a lift-off pattern by photolithography through the exposure of the front side of the substrate;
   forming a plurality of the channel layers; and
   lifting off the channel layer on the photoresist by removing the resist to form a pattern.

6. The method of manufacturing a field effect transistor according to claim 1, comprising:
   forming a channel layer and a source and drain electrode layer,
   wherein this step includes:
   applying a negative resist to form a lift-off pattern by photolithography through the exposure of the front side of the substrate;
   applying a positive resist to form a lift-off pattern by photolithography through the exposure of the rear side of the substrate using the light blocking film as a mask;
   forming a plurality of the source and drain electrodes;
   lifting off the source and drain electrode film on the photoresists by removing the photoresists to form a pattern;
   forming a plurality of the channel layers; and
   applying a resist to pattern the channel layer by photolithography through the exposure of the front side of the substrate.

7. The method of manufacturing a field effect transistor according to claim 1, comprising:
   forming a channel layer and a source and drain electrode layer,
   wherein this step includes:
   applying a resist to pattern the channel layer by photolithography through the exposure of the front side of the substrate;
   applying a positive resist to form a lift-off pattern by photolithography through the exposure of the rear side of the substrate using the light blocking film as a mask;
   forming a plurality of the source and drain electrodes; and
   lifting off the source and drain electrode films on the photoresists by removing the photoresists to form a pattern.

8. The method of manufacturing a field effect transistor according to claim 1, comprising:
   forming a channel layer and a source and drain electrode layer,
   wherein this step includes:
   applying a positive resist to form a lift-off pattern by photolithography through the exposure of the rear side of the substrate using the light blocking film as a mask;
   forming a plurality of the source and drain electrodes;
   lifting off the source/rain electrode films on the photoresist by removing the photoresist to form a pattern;
   forming a plurality of the channel layers; and
   applying a resist to pattern the channel layers by photolithography through the exposure of the front side of the substrate.

9. A method of manufacturing a transparent device, comprising:
   preparing a translucent substrate having a light blocking film with a predetermined pattern on the rear side; and
   forming a first translucent electrode pattern and a second translucent electrode pattern on the front side of the translucent substrate by using the light blocking film as a photomask.

10. The method of manufacturing a transparent device according to claim 9, comprising the step of forming a translucent insulating film and the step of forming an oxide film semiconductor layer between the step of forming the first translucent electrode pattern and the step of forming the second translucent electrode pattern.

11. The method of manufacturing a transparent device according to claim 9, comprising the step of forming a translucent insulating film between the step of forming the first translucent electrode pattern and the step of forming the second translucent electrode pattern and the step of forming an oxide film semiconductor layer after the step of forming the second translucent electrode pattern.

12. The method of manufacturing a transparent device according to claim 9, comprising the step of forming a translucent insulating film between the step of forming the first translucent electrode pattern and the step of forming the second translucent electrode pattern and the step of forming an oxide film semiconductor layer before the step of forming the first translucent electrode pattern.

13. The method of manufacturing a transparent device according to claim 9, comprising the step of forming an oxide film semiconductor layer and the step of forming a translucent insulating film between the step of forming the first translucent electrode pattern and the step of forming the second translucent electrode pattern.

14. A method of manufacturing a field effect transistor, comprising:
preparing a translucent substrate having a light blocking film with a predetermined pattern on the rear side; and
forming a translucent gate electrode pattern and a translucent source and drain electrode pattern on the front side of the translucent substrate by using the light blocking film as a photomask.

15. The method of manufacturing a field effect transistor according to claim 14, comprising the step of forming a translucent gate insulating film and the step of forming an oxide film semiconductor layer which will become a channel between the step of forming the translucent gate electrode pattern and the step of forming the translucent source and drain electrode pattern.

16. The method of manufacturing a field effect transistor according to claim 14, comprising the step of forming a translucent gate insulating film between the step of forming the translucent gate electrode pattern and the step of forming the translucent source and drain electrode pattern and the step of forming an oxide film semiconductor layer which will become a channel after the step of forming the translucent source and drain electrode pattern.

17. The method of manufacturing a field effect transistor according to claim 14, comprising the step of forming a translucent gate insulating film between the step of forming the translucent source and drain electrode pattern and the step of forming the translucent gate electrode pattern and the step of forming an oxide film semiconductor layer which will become a channel before the step of forming the translucent source and drain electrode pattern.

18. The method of manufacturing a field effect transistor according to claim 14, comprising the step of forming an oxide film semiconductor layer which will become a channel and the step of forming a translucent gate insulating film between the step of forming the translucent source and drain electrode pattern and the step of forming the translucent gate electrode pattern.

19. The method of manufacturing a field effect transistor according to claim 14, further comprising the step of removing the light blocking film from the translucent substrate after the step of forming the translucent gate electrode pattern and the translucent source and drain electrode pattern on the front side of the translucent substrate.

* * * * *